(12) United States Patent
Drabe

(10) Patent No.: US 7,872,319 B2
(45) Date of Patent: Jan. 18, 2011

(54) DEFLECTABLE STRUCTURE, MICROMECHANICAL STRUCTURE COMPRISING SAME, AND METHOD FOR ADJUSTING A MICROMECHANICAL STRUCTURE

(75) Inventor: Christian Drabe, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 243 days.

(21) Appl. No.: 12/045,117

(22) Filed: Mar. 10, 2008

(65) Prior Publication Data
US 2008/0241462 A1 Oct. 2, 2008

(30) Foreign Application Priority Data
Apr. 2, 2007 (DE) .................. 10 2007 015 726

(51) Int. Cl.
*H01L 29/72* (2006.01)
(52) U.S. Cl. .................. 257/414; 257/419; 257/618; 257/622; 428/101
(58) Field of Classification Search .................. 257/414, 257/419, 618, 622; 428/101; 438/106
See application file for complete search history.

(56) References Cited

U.S. PATENT DOCUMENTS 6,539,798 B1 *  4/2003  Geiger et al. .................. 73/488
6,668,628 B2   12/2003  Hantschel et al.
6,819,822 B2   11/2004  Behin et al.
6,840,642 B2    1/2005  Ishikawa et al.
7,195,946 B2    3/2007  D'Arrigo et al.
2002/0012490 A1  1/2002  Farmer, III et al.
2006/0154448 A1  7/2006  Stoll et al.

FOREIGN PATENT DOCUMENTS

DE    102 20 371 A1   11/2003
DE    102 41 450 A1    3/2004

OTHER PUBLICATIONS

Official communication issued in counterpart German Application No. 10 2007 015 726.8, mailed on Mar. 2, 2009.
V.P. Jaecklin et al., "Optical Microshutters and Torsional Micromirrors for Light Modulator Arrays," Micro Electro Mechanical Systems, 1993, MEMS '93, Proceedings, IEEE, Feb. 7-10, 1993, pp. 124-127.

* cited by examiner

*Primary Examiner*—Edward Wojciechowicz
(74) *Attorney, Agent, or Firm*—Keating & Bennett, LLP

(57) ABSTRACT

A deflectable structure includes a layer having a first area and a second area, a trench structure in the layer which penetrates the layer and separates the first area from the second area, a first junction between the first area and the second area, and a second junction between the first area and the second area, the first area being permanently moveable from a first, permanent position with regard to the second area to a second position, deflected as compared to the first position, with regard to the second area by applying a force.

35 Claims, 17 Drawing Sheets

DEFLECTABLE STRUCTURE, MICROMECHANICAL STRUCTURE COMPRISING SAME, AND METHOD FOR ADJUSTING A MICROMECHANICAL STRUCTURE

CROSS-REFERENCE TO RELATED APPLICATIONS

This application claims priority from German Patent Application No. 102007015726.8, which was filed on Apr. 2, 2007, and is incorporated herein in its entirety by reference.

TECHNICAL FIELD

The present invention relates to a deflectable structure, to a micromechanical structure comprising same, and to a method for adjusting a micromechanical structure, and in particular to an element and a method for positioning and deflecting MEMS structures (MEMS=micro electro mechanical system).

BACKGROUND

In the field of MEMS devices it is advantageous to be able to permanently change the positions of structures manufactured in planar technology. This may be exploited, for example, for component properties such as resonant frequency. In addition, this may be also be utilized for the defined positioning of structures in three-dimensional space, for example for mirrors or electrodes.

There are various known possibilities of achieving the angle/lift offset relative to the planar surface of the layer or substrate, which is necessary for the deflection, said layer or substrate having an MEMS device realized therein.

A first approach is to utilize the bimorph effect. Here, the structures employed have applied thereon, by applying a layer, an intrinsic stress resulting in an angle, or to a difference, between a flat surface, normally the surface of the layer, and the actuator formed in the layer, that is the MEMS device. This procedure results in layer stresses, which in turn result in the structures being "positioned" relative to the layer surface. The disadvantage of this procedure is that here the actuators are automatically activated once they have been exposed.

A further approach known is to exploit surface forces for positioning an actuator. The structures used here have a mechanical stress applied to them by applying a liquid, for example a polymer, said mechanical stress in turn resulting in an angle or a difference between the flat surface and the actuator. Unlike the bimorph effect described above, wherein the structures where positioned on the basis of layer stresses, positioning of the structures here is achieved on the basis of the surface tensions of the polymer used. The disadvantage of this procedure is that a very high level of dosage accuracy is necessary for applying the liquid so as to be able to achieve specific repeatability of the surface states. This approach of using surface forces is employed, for example, by Patterson, P. R. et al. in "A Scanning Micromirror With Angular Comb Drive Actuation", pages 544-547, Micro Electro Mechanical Systems, IEEE Las Vegas, 2002.

A further approach known to positioning the actuators consists in using mechanical elements. The structures used here are positioned below or above the flat surface by a mechanical element, possibly temporarily using thermal fixation in the position. This is effected, for example, within the framework of the manufacturing steps for finishing the devices which follow the production of the MEMS devices, for example within the framework of structural design and coupling technology. The disadvantage of this procedure is that a very high level of positioning accuracy, or tight tolerances, are necessary. This approach is described, for example, by Jongbaeg Kim, et al. in "Microfabricated Torsional Actuators Using Self-Aligned Plastic Deformation of Silicon", Journal of Microelectromechanical Systems, VOL. 15, NO. 3, June 2006.

In addition, one has known an approach using so-called multilayers. Here, a layer stack of several conductive layers which are insulated from one another is provided which enables three-dimensional potential distribution. This approach is only possible with expensive process steps, necessitates expensive contacting, and results in only small deflections. This approach is described, for example, by Huikai Xie, et al. in "Vertical Comb-finger Capacitive Actuation And Sensing For CMOS-MEMS", IEEE International Workshop on Micro Electro Mechanical Systems (MEMS—2001) No. 14, Interlaken, 2002, vol. 95, no. 2-3 (20 ref.), pages 212-221.

Yet another approach known is to use different layer thicknesses. Here, different geometrical dimensions of an actuator and a counter electrode are selected to enable a deflection of the element. The disadvantage of this procedure is that only small deflections are possible, as is described by W. Noell, et al. in "Compact And Stress released Piston Tip tilt Mirror" SPIE 6186-16, 2006.

The above brief discussion shows that one has known various approaches of deflecting an MEMS device, for example an actuator, and positioning it in the deflected position. However, the known approaches have a number of disadvantages associated with them, namely that the elements which cause the deflection and positioning of the MEMS structures have intrinsically had this property and therefore do not enable activation at any predefined point in time. Rather, the activation is specified by the progress made in the process during manufacturing of the overall structure. A further disadvantage is that the conventional approaches have only a low level of positioning accuracy and a low level of repeatability. In addition, the known approaches place very high demands upon the alignment accuracy.

SUMMARY

According to an embodiment, a deflectable structure may have: a layer including a first area and a second area; a trench structure in the layer which penetrates the layer and separates the first area from the second area; a first junction between the first area and the second area; and a second junction between the first area and the second area; the first area being permanently moveable from a first, permanent position with regard to the second area to a second position, deflected as compared to the first position, with regard to the second area by applying a force.

According to another embodiment, a micromechanical structure may have: a layer which further has the deflectable structure including: a layer including a first area and a second area; a trench structure in the layer which penetrates the layer and separates the first area from the second area; a first junction between the first area and the second area; and a second junction between the first area and the second area; the first area being permanently moveable from a first, permanent position with regard to the second area to a second position, deflected as compared to the first position, with regard to the second area by applying a force formed therein, the first area of the deflectable structure acting upon the micromechanical structure by the movement from the first position to the second position.

According to another embodiment, a method of adjusting a micromechanical structure may have the steps of: providing a layer which has the micromechanical structure and a deflectable structure including: a layer including a first area and a second area; a trench structure in the layer which penetrates the layer and separates the first area from the second area; a first junction between the first area and the second area; and a second junction between the first area and the second area; the first area being permanently moveable from a first, permanent position with regard to the second area to a second position, deflected as compared to the first position, with regard to the second area by applying a force formed therein; and applying a force to the first area so as to move the first area from the first position to the second position.

Embodiments of the invention relate to a deflectable structure wherein the second junction between the first area and the second area is implemented as a predetermined breaking point and which includes a structure in the first area which in cooperation with the first area creates a mechanical stress so as to bias the first area relative to the second area such that breakage of the predetermined breaking point causes a movement of the first area from the first, original position to the second, deflected position with regard to the second area. Compared to the above-described level of knowledge, these embodiments of the invention follow a novel approach in accordance with which a structure which is generated while the MEMS devices are processed has an intrinsic stress built into it, the lateral action of which is exploited. This intrinsic stress may be effected, for example, by combining materials having different thermal expansion coefficients, for example by arranging them in an asymmetrical manner. The materials used are advantageously mono-Si, $SiO_2$, $Si_3N_4$, Al, W, and poly-Si. The geometry of the inventive deflectable structure is such that any change of shape caused by the stress, or the tension, will not result until after the activation of the structure, it being possible for this activation to be effected, for example, in a thermal (melting) or mechanical (breakage) manner. On the basis of the change of shape, a further, or the same, element may then be fixed in a defined position.

The advantage of the present invention is that in this manner, a deflectable structure is provided which may be activated at a predefined point in time. In addition, the inventive structure provides a high level of positioning accuracy/repeatability by means of a defined layout without requiring a high level of alignment accuracy. Also, it is without any additional expenditure that the inventive approach may be integrated into existing manufacturing processes for micromechanical structures.

Examples of an application of the inventive structure are, for example, the change of natural frequencies of mechanical devices, such as in microscanners and phase-shifting elements. Further applications are, for example, optical switching elements, measuring devices and projectors which necessitate a quasi-static deflection of MEMS devices which are operated in a rotational or translational manner, such as microscanners or phase-shifting mirrors or relocatable mirrors for optical path length modulation. In this context, the most favorable variant in terms of energy is the utilization of electrostatic forces for deflecting the actuators, with the best-known solution, namely the use of electrodes with a parallel-plane alignment to the mirror plate, resulting in the necessity of extremely high electrical voltages and, at the same time, a low level of deflection achievable. A more favorable approach consists in using the lateral capacitances of an actuator plate with corresponding three-dimensional deflection possibilities, e.g. finger electrodes.

In accordance with preferred embodiments of the present invention, the structure in the deflectable structure is formed such that a movement and a direction parallel with a surface of the layer, or a movement about an axis parallel with a surface of the layer are effected, i.e. either a translational movement or a rotational movement. In a former case (movement in parallel to the surface), the structure will penetrate the layer. In the second case (movement about an axis parallel with the surface), the structure will only partly penetrate into the layer.

The structure comprises at least one portion made of a material creating stress, said material resulting in tensile stress or compressive stress. As a function of the forces necessary or desired, or of the deflection desired, it is also possible for several structures to be provided. In accordance with a first embodiment, the structure is arranged in an asymmetrical manner in the first area so as to cause a movement transverse to a longitudinal dimension of the at least one portion as soon as the predetermined breaking point has been interrupted. Alternatively, the structure is symmetrically arranged in the first area so as to cause a movement in a direction along a longitudinal dimension of the at least one portion as soon as the predetermined breaking point has been interrupted. The closer the structure is located to the trench, the larger the achievable level of deflection.

In accordance with a preferred embodiment of the present invention, the deflectable structure, or the first area of same, is configured to be of annular or rectangular shape, or have the shape of a beam. The annular structure is preferred, since here the lateral movements of the center of the beam, which possibly occur with beam-shaped structures, cannot occur, i.e. since the annular element will not change its shape before the breakage of the predetermined breaking point.

In accordance with a further embodiment, the inventive deflectable structure may additionally comprise an actuating element, for example a bolt or the like, which is deflected in the event of a breakage of the predetermined breaking point. In this case, the actuating member is advantageously connected to the remaining area of the layer via the first junction. In such an embodiment, provision may further be made for the structure to comprise a plurality of portions arranged symmetrically relative to the actuating element. In addition, provision may be made for a structure to be formed in the layer which bears the actuating element.

In accordance with a further embodiment, the first area of the structure may comprise an actuating field to which a force for breaking through the predetermined breaking point may be applied. Alternatively, supply lines for supplying thermal or electrical energy may be provided so as to be able to provide the energy necessitated for breaking through the predetermined breaking point. Likewise, energy for breaking through the predetermined breaking point may be applied in a contact-less manner, e.g. by means of a laser. The predetermined breaking point may be arranged at any location within the trench. It is also possible for several predetermined breaking points to be provided.

Embodiments of the invention relate to a deflectable structure wherein the first area comprises a central portion and to essentially opposite suspensions, the first junction being located between the second area and the first suspension, and the second junction being located between the second area and the second suspension. The central portion may be moveable from the first position to the second position in a direction parallel to a surface of the layer, the first suspension and the second suspension being arranged, in the first position, such that the first junction and the second junction are located, in the direction of movement of the central portion, before the respective suspension locations where the first and second suspensions are each connected to the central portion, and the first suspension and the second suspension being located, in the second position, such that the first junction and the second junction are located, in the direction of the movement of the central portion, behind the respective suspension locations. The deflectable structure may comprise two further suspensions which are located essentially opposite. The central portion and the suspensions may each be beam-shaped. The central portion may further comprise an area across which a force for moving to the second position may be applied. The area may comprise a plurality of electrode structures for electrostatic coupling to external counter electrode structures.

When using the inventive deflectable structure, provision is made for modifying a property of a micromechanical structure, for example of an MEMS device. In this context, provision may be made for removing part of the structure to be modified, as a result of which a resonance property or a torsion property of a micromechanical element will be changed, for example. The portion or part of the element which is to be removed is separated from the element by a breakage and then no longer has any influence on the properties of the element. In such a case it must be ensured that after the breakage, the break edges are spaced apart from one another. In order to ensure this, the inventive structure is provided which after the breakage moves apart the break edges on the basis of the intrinsic stresses.

When using the inventive deflectable structure with a micromechanical structure, for example with an MEMS device, provision is made of a micromechanical element which may be deflected relative to a surface of the layer, the deflectable structure being provided in order to keep the micromechanical element in the deflected position after a deflection of the micromechanical element and by the movement from the first position to the second position. Advantageously, the micromechanical element is an element which may be swiveled about an axis parallel to the layer, so that after swiveling the micromechanical element from the plane of the layer, and by the movement from the first position to the second position of the deflectable structure, the first area, or an actuating element of the first area, will slide to a position underneath or over the micromechanical element and thus keep it in a desired position.

In another embodiment, provision may be made for the micromechanical element to comprise a support structure, such as a support structure for keeping a scanner mirror, electrodes or electrode fingers spaced apart from a surface of the layer or at an angle to the surface of the layer. This support structure is connected to the deflectable structure in accordance with the present invention, so that the micromechanical element, its support structure as well as the inventive deflectable structure initially are located in the plane of the layer. If the predetermined breaking point is destroyed, the torsions are released from within the deflectable structure, which results in a corresponding movement of the first area of the deflectable structure connected to the support structure of the micromechanical element, and thus results in fixing the element such that it is spaced apart from a surface of the layer.

In a further embodiment, the inventive structure is connected to the micromechanical element so as to change a physical property of same when the predetermined breaking point is destroyed.

BRIEF DESCRIPTION OF THE DRAWINGS

Embodiments of the present invention will be detailed subsequently referring to the appended drawings, in which.

DETAILED DESCRIPTION

In the description which follows, the expression "plurality" shall be used in the meaning of two or more.

Figure 1A:
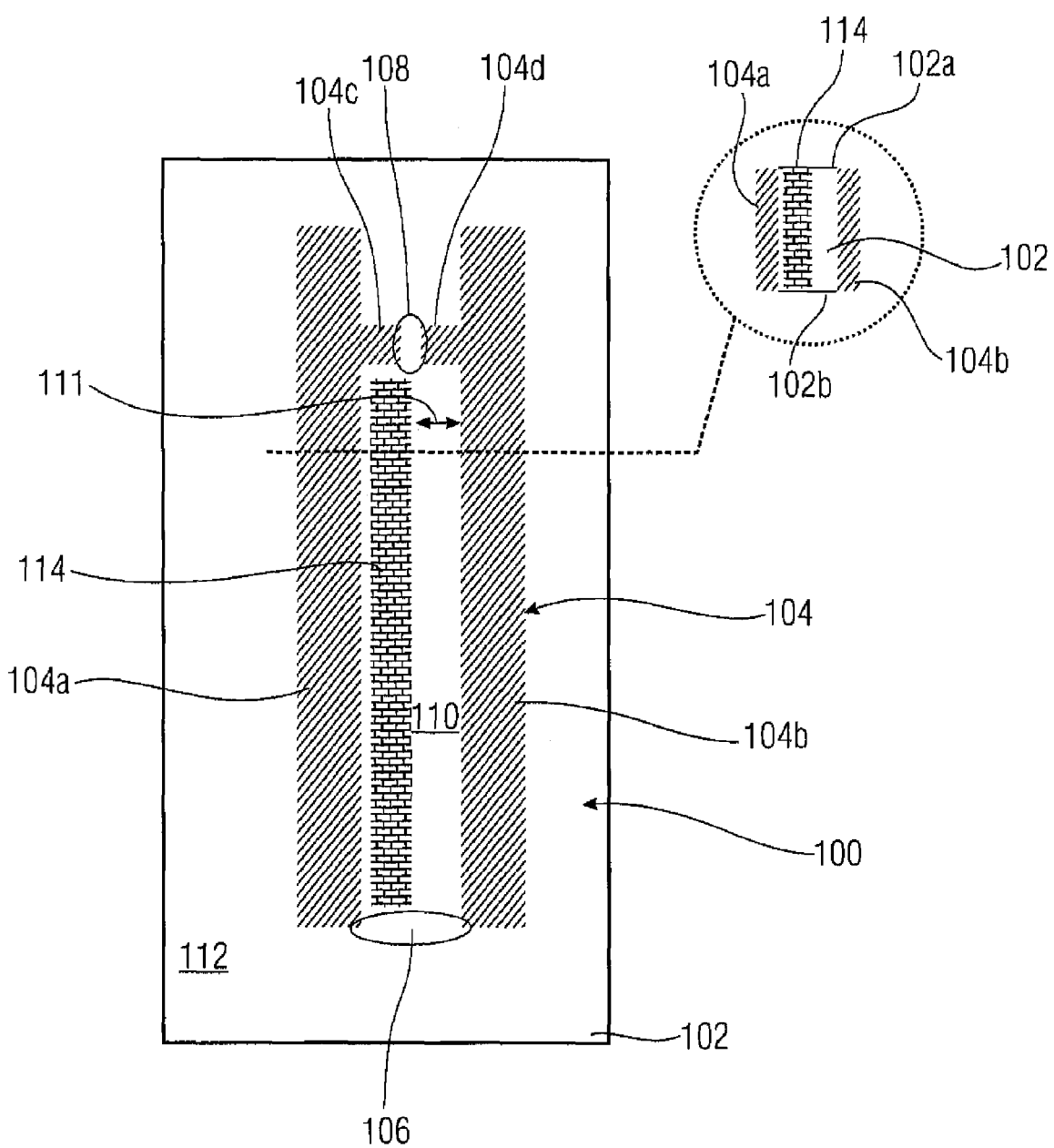
FIG. 1(A) shows a top view of a deflectable structure in accordance with a first embodiment of the present invention.

FIG. 1(A) shows a first embodiment of the inventive deflectable structure, which is designated by reference numeral 100 in its entirety. The deflectable structure 100 is formed in a layer 102 (e.g. a substrate or a plate) schematically shown in FIG. 1(A). The layer 102 has a trench structure 104 formed therein which fully penetrates the layer. The trench structure 104 comprises a first trench 104*a* and a second trench 104*b*. The trench structure 104 is formed such that a first junction 106 and a second junction 108 are formed between a first area 110 of the layer 102 and a second area 112 of the layer 102. The first area 110 is that area defined by the trench structure 104 and the junctions 106 and 108 which is separated from the second area 112 by the trench structure and is connected to the second area only via the junctions 106 and 108. In addition, FIG. 1(A) shows a structure 114 which in corporation with the first area creates a mechanical stress and extends essentially in parallel with the two trenches 104*a* and 104*b*, and which is formed in the first area 110 such that it is spaced apart from the trench 104*a* and spaced apart from the trench 104*b*. FIG. 1(A) further represents, in cross section (see dashed-line circle), part of the structure shown. As can be seen, the trenches 104*a* and 104*b* penetrate the layer 102 from its first surface 102*a* to its second surface 102*b*. As can also be seen, in the preferred embodiment, the structure 114 is formed such that it penetrates the entire thickness of the area 110, i.e. extends from the first surface 102*a* to the second surface 102*b* of the layer 102. In this manner, a movement parallel with the surface of the layer is enabled (after breakage of the predetermined breaking point).

One may also see from FIG. 1(A) that in addition to the two parallel trenches 104*a* and 104*b*, the trench structure comprises two further portions 104*c* and 104*d* which are located opposite each other at a first portion of the respective trenches and define the second junction 108 by the remaining area of layer material which is located between the portions 104*c* and 104*d*. As may be seen, the second junction 108 is configured to be clearly narrower than the first junction 106, which is intentional since the second junction 108 is to act as a predetermined breaking point. This predetermined breaking point may be interrupted using a small amount of thermal expenditure or mechanical expenditure, which shall be explained in more detail below. The dimension of the predetermined breaking point is selected such that it comprises sufficient strength to withstand the forces caused by the structure, and at the same time to enable a simple solution (breakage). The distance between the trench portions 104*c* and 104*d* is advantageously formed such that it ranges from about 0.1 μm to about 5 μm.

Additionally, provision may be for thinning the layer 102 in the area of the junction 108, so that it will have a reduced thickness so as to achieve reliable breakage at this point upon application of the thermal energy or the mechanical energy.

In the deflectable structure shown in FIG. 1(A), the structure 114 is located asymmetrically within the area 110 and advantageously extends from the first junction 106 to the second junction 108 in the first area 110. The structure shown in FIG. 1(A) with the structure 114 is fixed at both ends 106 and 108, and once the predetermined breaking point 108 is broken, the element, or the area 110 moves out of its original position, shown in FIG. 1(A), in the lateral direction (see arrow 116) because of the intrinsic stress. The position of the predetermined breaking point 108 is represented by way of example. The predetermined breaking point may also be provided at a different location. Likewise, several predetermined breaking points may be provided.

Figure 1B:
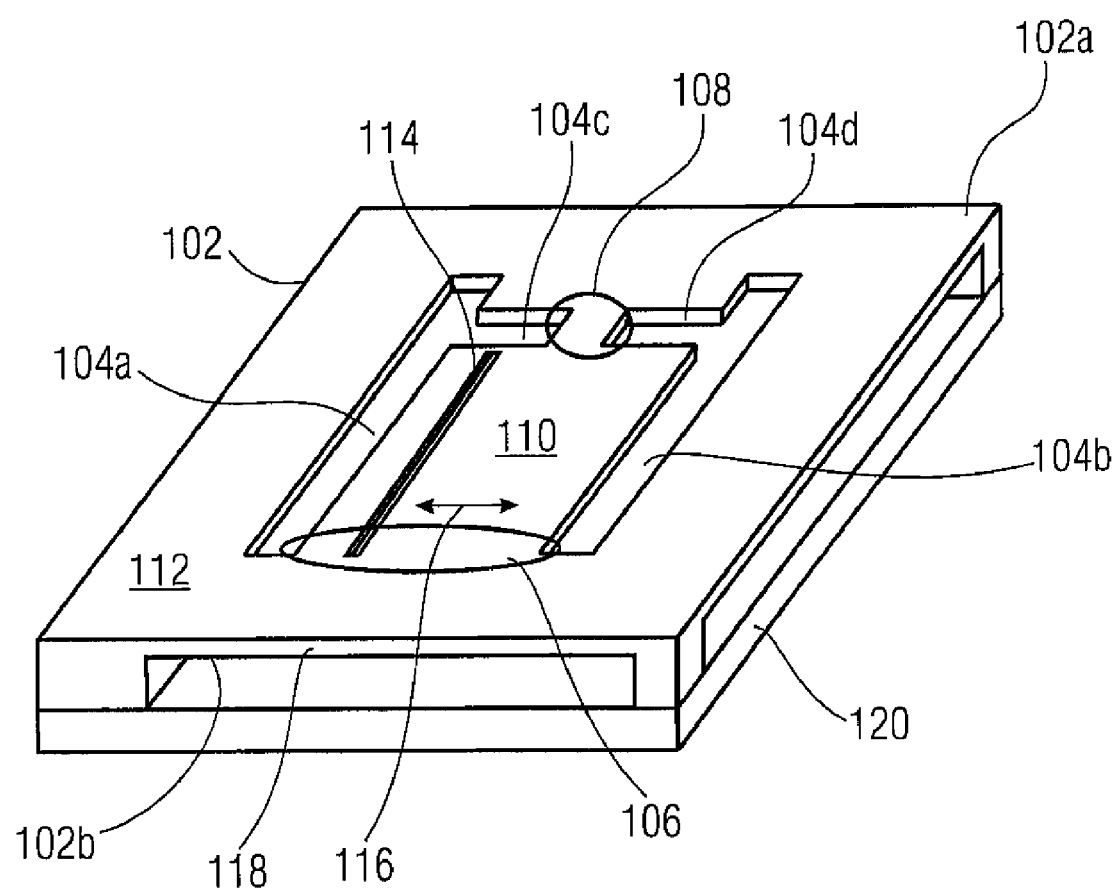
FIG. 1(B) shows an isometric representation of the deflectable structure of FIG. 1(A)

FIG. 1(B) shows an isometric representation of the inventive structure of FIG. 1(A), and in FIG. 1(B), identical reference numerals designate identical elements, the repeated description of which shall be dispensed with for simplicity's sake. As may be seen in FIG. 1(B), the layer 102 may comprise a membrane area 118 wherein the inventive structure may be formed. The trenches 104*a* to 104*d* are formed such that they fully penetrate the layer 102 in the membrane area 118 from the first surface 102*a* to the second surface 102*b*, as was described above with reference to FIG. 1(A). Within the membrane area 118, the thickness of the layer 102 is smaller than outside the membrane area 118, as may be seen in FIG. 1(B). In addition, FIG. 1(B) shows an optional support 120 supporting the layer 102 with the structure formed therein. However, other support structures are possible instead of the support 120 shown, and the present invention is not limited to the embodiment shown in FIG. 1(B). For example, the structure may be created in a layer without a membrane, or advantageously on a BSOI material with a membrane.

Figure 2A:
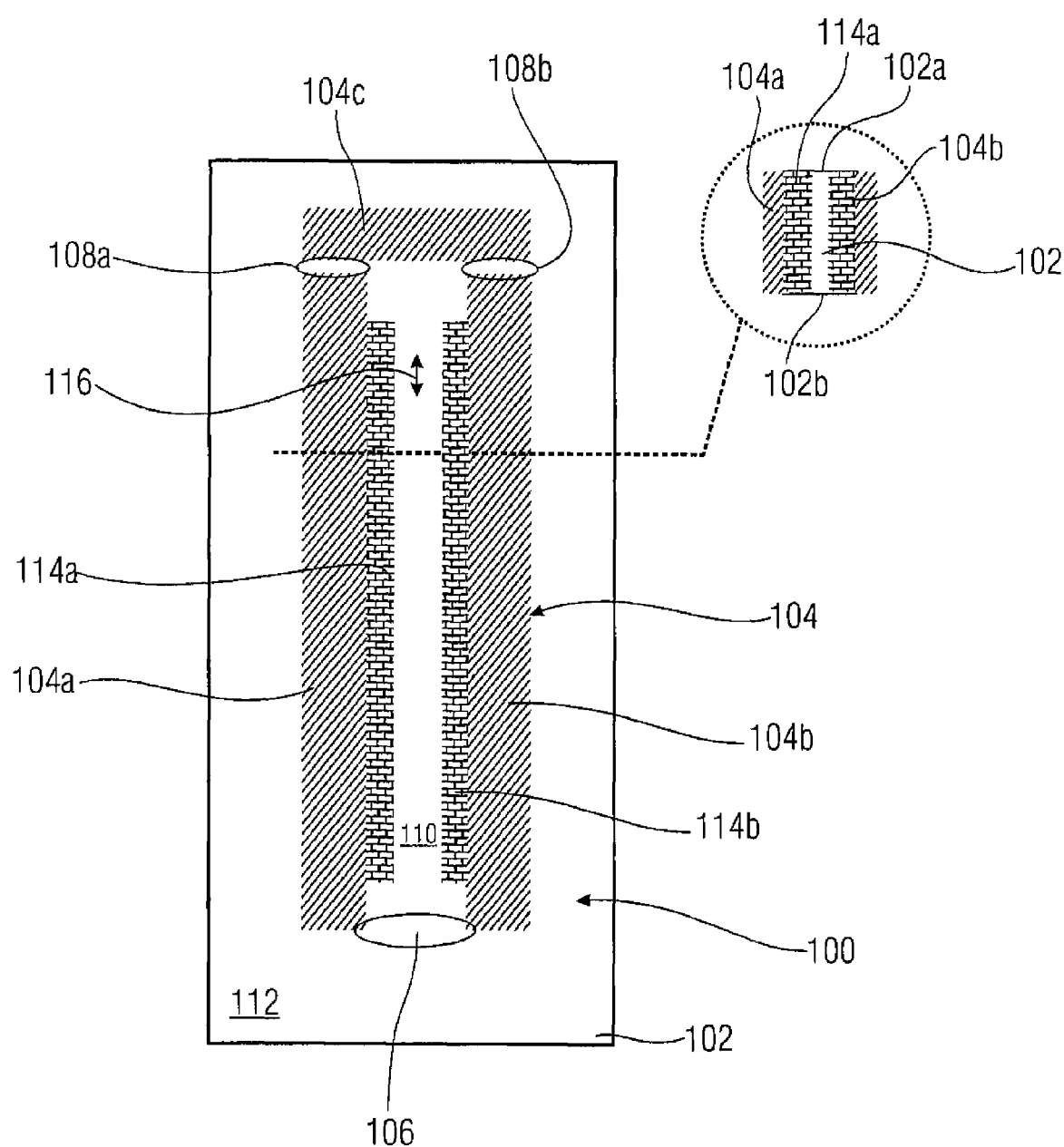
FIG. 2(A) shows a top view of a deflectable structure in accordance with a second embodiment of the present invention.

FIG. 2(A) shows a second embodiment of the inventive deflectable structure, identical elements being provided with identical reference numerals, and a repeated description of these elements which have already been described with reference to FIG. 1(A) being dispensed with in FIG. 2(A) as well.

As compared with FIG. 1(A), FIG. 2(A) shows an embodiment wherein the area 110 moves in a direction along the longitudinal dimension of the structure once the predetermined breaking point has been dissolved. As may be seen from FIG. 2(A), the structure known from FIG. 1(A) has been modified, specifically in such a manner that the structure 114 comprises a first portion 114*a* and a second portion 114*b* which are symmetrically arranged in the first area 110. Similar to FIG. 1(A), the trench structure 104 comprises the two parallel trenches 104*a* and 104*b* formed in the layer, as may be seen from the magnified cross sectional representation (see dashed-line circle). In addition, a transverse trench 104*e* is formed adjacent to the two first (in FIG. 2(A), upper) ends of the trenches 104*a* and 104*b*, said transverse trench 104*e* being spaced apart by a predetermined distance from the ends of the two trenches 104*a* and 104*b* so as to define two predetermined breaking points 108*a* and 108*b*, the distance of the trenches here advantageously ranging from 0.1 μm to 5 μm. Again, provision may be made for additionally thinning the layer 102 in the area of the predetermined breaking points 108*a* and 108*b*. As may also be seen from FIG. 2(A), the portion 114*a* of the structure is located adjacent to the trench 104*a*, and the second portion 114*b* of the structure is located parallel to the first portion 114*a* and adjacent to the second trench 104*b*. In this manner, two symmetrically arranged structures 114*a*, 114*b* are defined. The element 110 again is fixed at both ends via the junctions 106, 108*a* and 108*b*. Once the two predetermined breaking points 108*a* and 108*b* have been torn, the element 110 moves out from its original position (shown in FIG. 2(A)) in a lateral direction because of the intrinsic stress, as is indicated by the arrow 116. The deflection shown is achieved on the basis of the implementation and arrangement of the structures shown in FIG. 2(A).

Figure 2B:
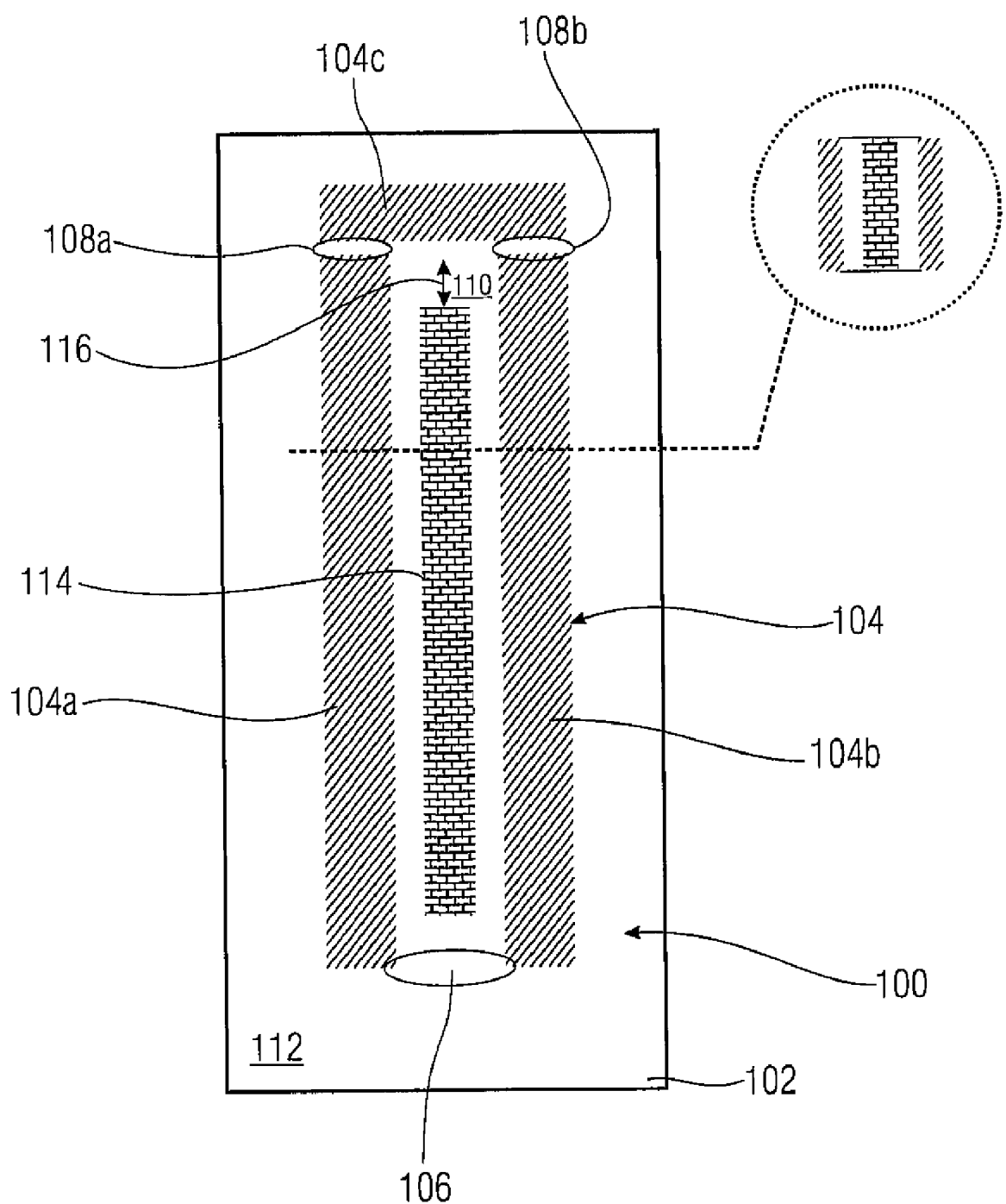
FIG. 2(B) shows a top view of a deflectable structure in accordance with a further implementation of the second embodiment of the present invention.

As is shown in FIG. 2(B), it is also possible that only one structure 114 is symmetrically provided in the first area 110, which results in the same deflection of the element 110 as was already described in FIG. 2(A).

Figure 3:
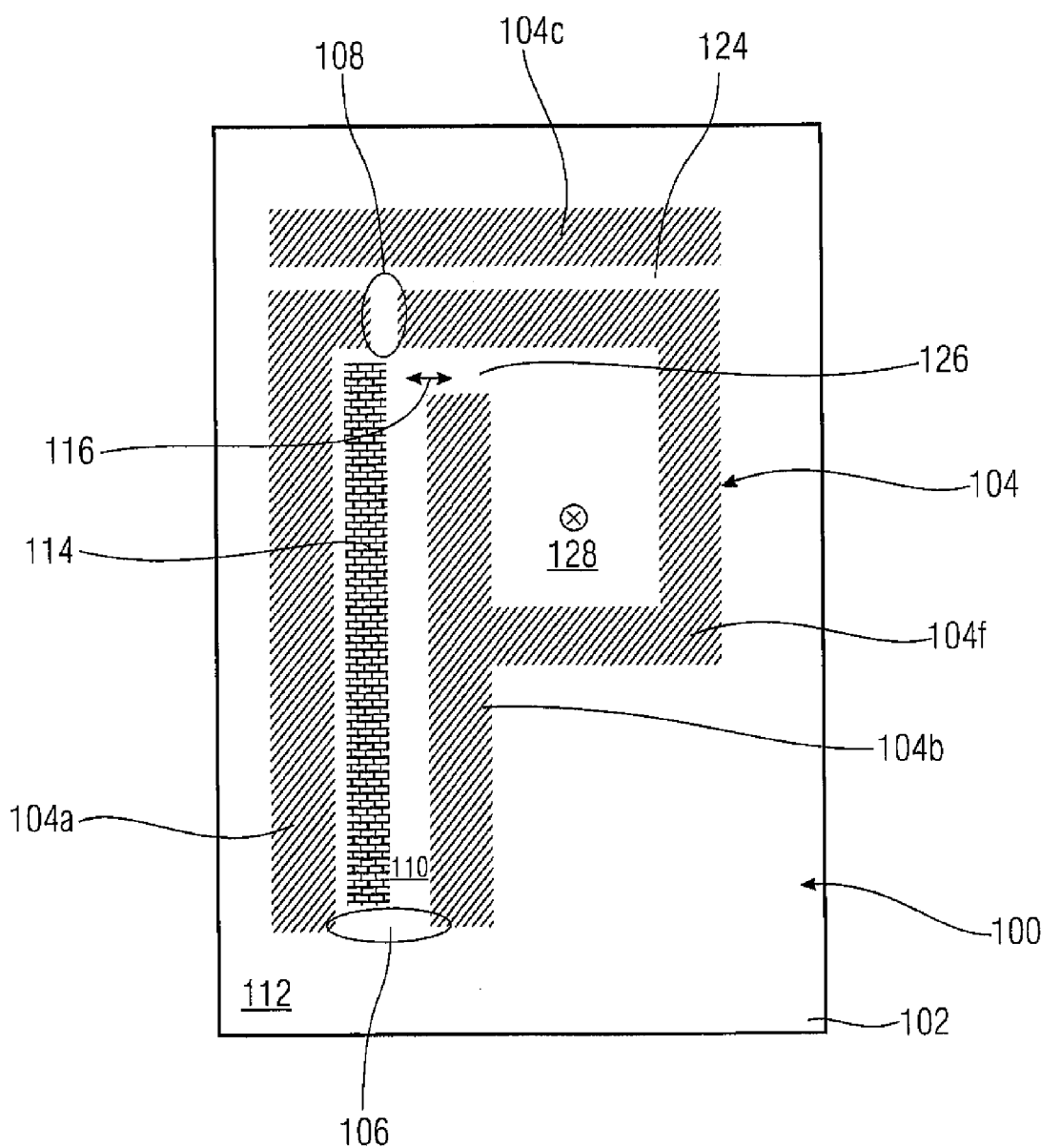
FIG. 3 shows a top view of a deflectable structure in accordance with a third embodiment of the present invention.

FIG. 3 shows an embodiment of the inventive deflectable structure in accordance with a third embodiment, wherein a micromechanical element 124 is in additionally shown. The deflectable structure shown in FIG. 3 is similar to the structure shown in FIG. 1(A). The trench structure 104 comprises the two parallel trenches 104*a* and 104*b*, the trench being interrupted in the area 126. Again, a first junction between the area 110 and the area 112 of the layer 102 is shown by reference numeral 106, and the trench portions 104*c* and 104*d* are spaced apart, similar to FIG. 1(A), to define the predetermined breaking point 108. Similar to FIG. 2(A), FIG. 3 also shows a further trench 104e extending perpendicularly to the trenches 104a and 104b and being arranged such that it is spaced apart from the two ends, shown at the upper end of FIG. 3, of the two trenches 104a and 104b so as to define the micromechanical structure 124, for example a torsional axis. As may also be seen in FIG. 3, a further trench 104f is formed which extends from any position of the second trench 104b, for example the center, to that end of the trench 104b which is the upper end in FIG. 3. Advantageously, the trench 104f is configured to have a rectangular shape, as is shown in FIG. 3, so as to enclose a rectangular area 128 connected to the first area 110 via the portion 126. The first area 128 is an "actuating area", via which a force may be exerted on the element 110, for example by needles or the like, so as to cause a breakage of the predetermined breaking point 108.

A preferred use of the implementation shown in FIG. 3 consists in a change in the rigidity of the torsional axis 124. In the situation shown in FIG. 3, the torsional rigidity is specified to have a specific value on the basis of the connection of the torsional axis 126 to the area 110. In order to change the torsional rigidity, the connection is to be interrupted at the location 108. Once the predetermined breaking point 108 is broken, the change in the torsional property is caused, for example, by means of pressure exerted on the actuating field 128, and the area 110 moves out from its original position in accordance with FIG. 3 and moves the break edges apart. By flipping back the former fixation (predetermined breaking point 108) there will be no collision with the axis in the event of a rotation, for example of a resonant micromirror, and since no structures are broken away, there will be no undefined fragments which might represent a disturbance in subsequent manufacturing steps, for example in connection with the structural design and coupling technology.

FIG. 4(A) shows the inventive deflectable structure in connection with a micromechanical structure, FIG. 4(A) showing a deflectable structure in accordance with a fourth embodiment of the present invention. Embodiments of the deflectable structure which are essentially implemented to be rectangular in shape were explained with reference to FIGS. 1 to 3. However, the present invention is not limited to such configurations. Rather, the deflectable structure may have any form which is necessitated by the conditions of the field of application. An embodiment wherein an angular configuration was selected instead of the rectangular implementation will be described with reference to FIG. 4(A).

FIG. 4(A) shows a first moveable area 110 and the trench structure 104, which comprises the annular trenches 104a and 104b. The adjacent ends of the trench 104a turn into the trench portions 104c and 104d. A structure 114 which is disposed in a circular manner is disposed at a distance from the inner trench structure 104b. Alternatively, several structures may be provided which are arranged in a circularly parallel and/or segmented manner. The area enclosed by the trench 104b defines an actuating area 128 for activating the element, as was described above with reference to FIG. 3. In the embodiment shown in FIG. 4(A), an area 110' which corresponds to the area 110 is also formed. The second area 110' is structured just like the first area 110, and the respective elements in FIG. 4(A) are provided with respective reference numerals plus an apostrophe ('). In addition, an actuating portion 132 (e.g. a bolt) is defined between the areas 110, 110', said actuating portion 132 being connected, at an end 106, to the area 112 of the layer 102. As may be seen, the element 132 is defined by trenches 133a and 133b in the layer 102, similar to the area 110. The two inner trenches 104a and 104a' are formed such as to define, between the trenches 104c and 104c', the predetermined breaking point 108 shown in FIG. 4(A).

Figure 4:
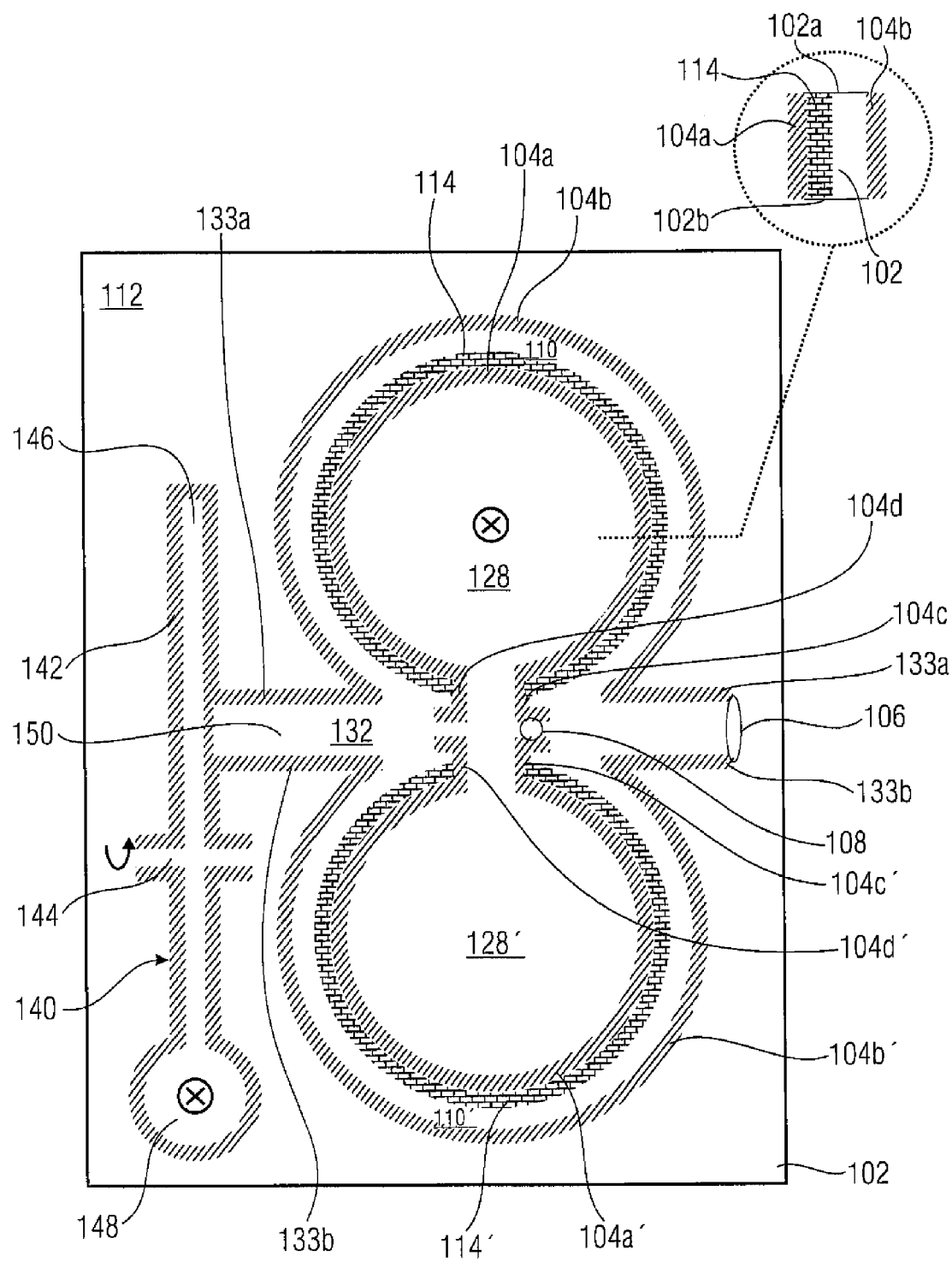
FIG. 4(A) shows a micromechanical structure having a micromechanical element and a deflectable structure in accordance with a fourth embodiment of the present invention.
FIG. 4(B) shows the structure of FIG. 4(A) wherein a bolt of the deflectable structure is supported by a two-sided support structure.
Figure 4:
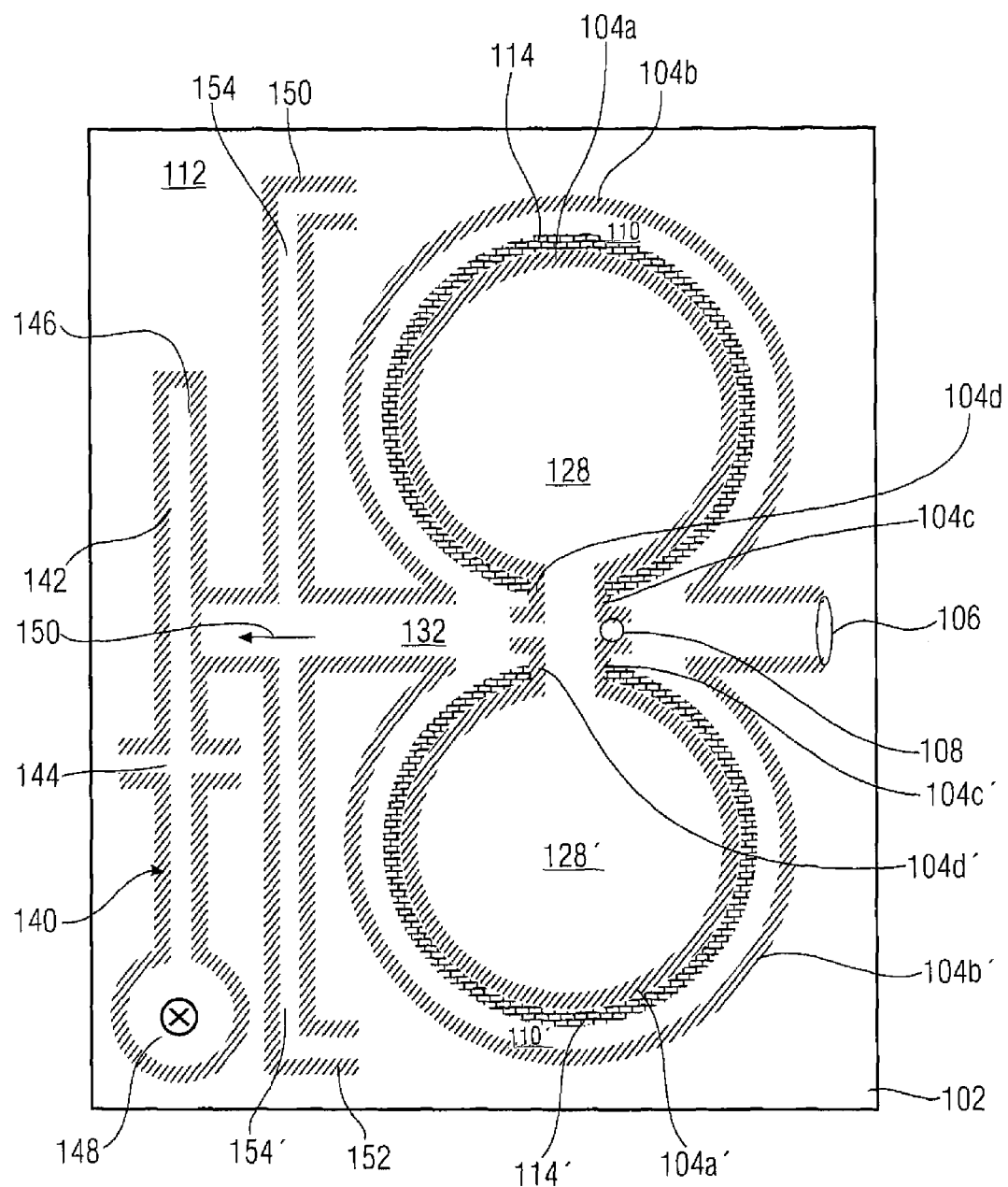

In addition, FIG. 4(A) shows a micromechanical element 140 which is also defined by a trench structure 142 in the layer 102. The configuration of the trench structure 142 is such that a suspension 144 is formed, around which a first portion 146 of the element 140 may be rotated. In addition, an actuating area 148 is formed by the structure of the trench 142, the actuation of said actuating area 148 causing the portion 146 to be deflected to a position above or below the layer surface 102a. If the micromechanical element 140 was deflected to a position above or below the surface 102a of the layer 102, actuating the actuating area 128 of the deflectable structure 110 will cause the predetermined breaking point 108 to be dissolved, and due to the intrinsic stresses, there will be a movement of the bolt 132 in the direction of the arrow 150, so that it will come to rest below or above the element 140 and will lock same in the position deflected relative to the layer surface 102a. As was already noted, breaking up the predetermined breaking point may also be effected by thermal energy generated, for example, by a laser beam or electric current. In the latter case, corresponding supply lines (not shown in FIG. 4) leading to the predetermined breaking point are provided so as to provide the electric energy for severing the predetermined breaking point.

In the embodiment shown in FIG. 4(A), the deflectable structure may be referred to as a locking element which includes the bias rings 110, 110' which had mechanical pressure applied to them because of the structures 114. Once the predetermined breaking point 108 is broken by means of pressure exerted on the surface 128, the bolt 132 is activated and may lock a functional element 140, which is deflected by pressure exerted on the surface 148, in the deflected position. The functional element 140 is deflected upward, for example, by means of pressure exerted on the surface, and is initially held there so as to avoid a return to the starting position. Once the bolt 132 is activated, the surface 148 is released, and the functional element 140 tries to return to its rest position on the basis of the restoring forces, but will then rest upon the bolt 132. Since the bolt is not rigidly mounted, because of the restoring forces of the functional element it will have a force applied to it which will somewhat deflect the bolt. Thus, the actual amount of deflection of the functional element is a function of the position where the bolt contacts the functional element, of the restoring forces acting there, and of the resilience of the bolt.

FIG. 4(B) shows a similar element to FIG. 4(A), but here, a further trench structure 150 or 152 is provided so as to define a support structure 154, 154' for the bolt 132. Apart from that, the example shown in FIG. 4(B) corresponds to the example shown in FIG. 4(A).

Figure 5:
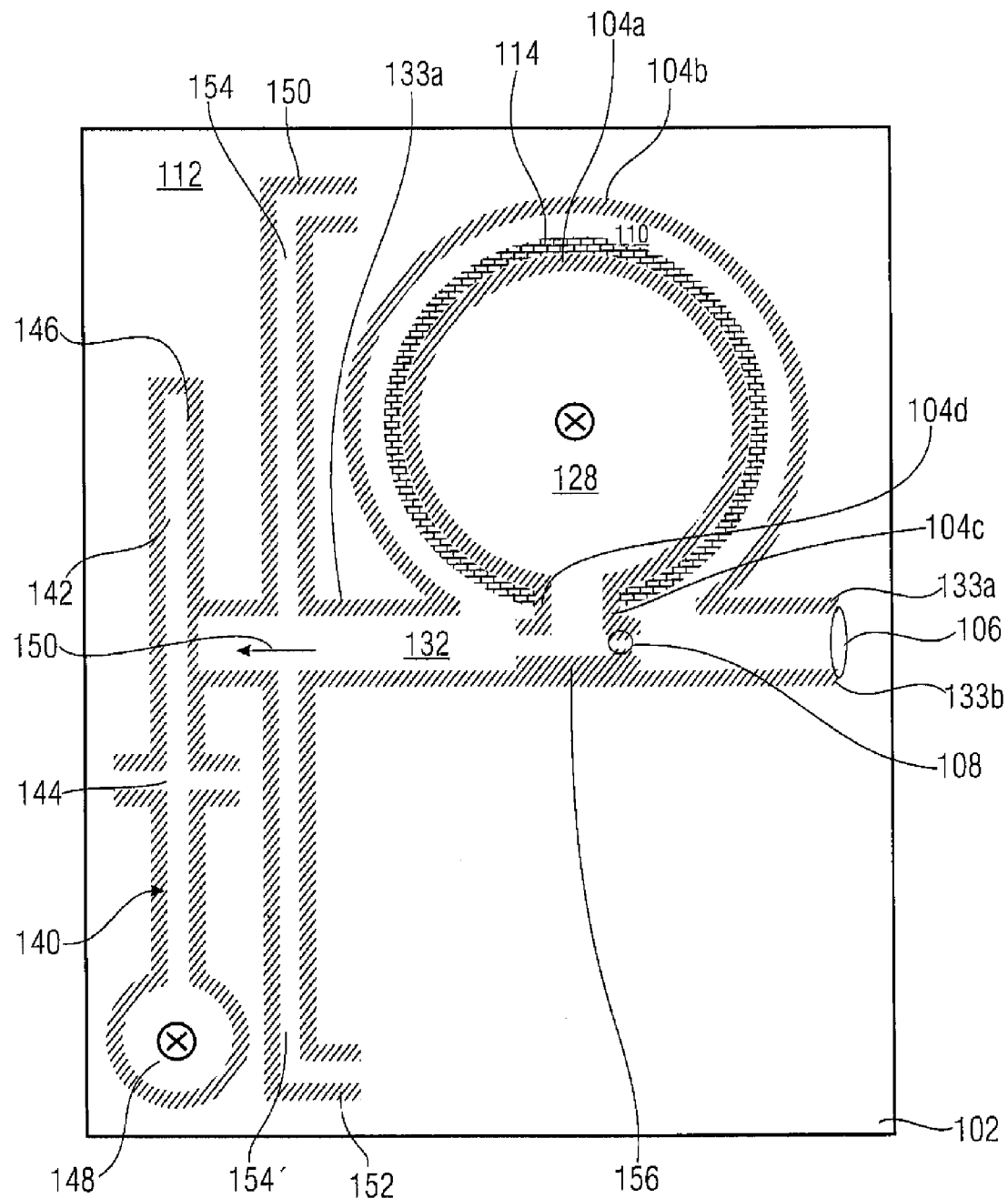
FIG. 5(A) shows a micromechanical structure having a micromechanical element and a deflectable structure in accordance with a fifth embodiment, wherein the bolt of the deflectable structure is supported on two sides.
FIG. 5(B) shows the micromechanical structure of FIG. 5(A), wherein the bolt is supported on one side.
FIG. 5(C) shows the micromechanical structure of FIG. 5(B), wherein the first area comprises a stop and a groove or depression for receiving part of the micromechanical element.
FIG. 5(D) shows the micromechanical structure of FIG. 5(C), wherein the first area comprises a stop and a hook, and the micromechanical element comprises a recess for receiving the hook.
Figure 5:
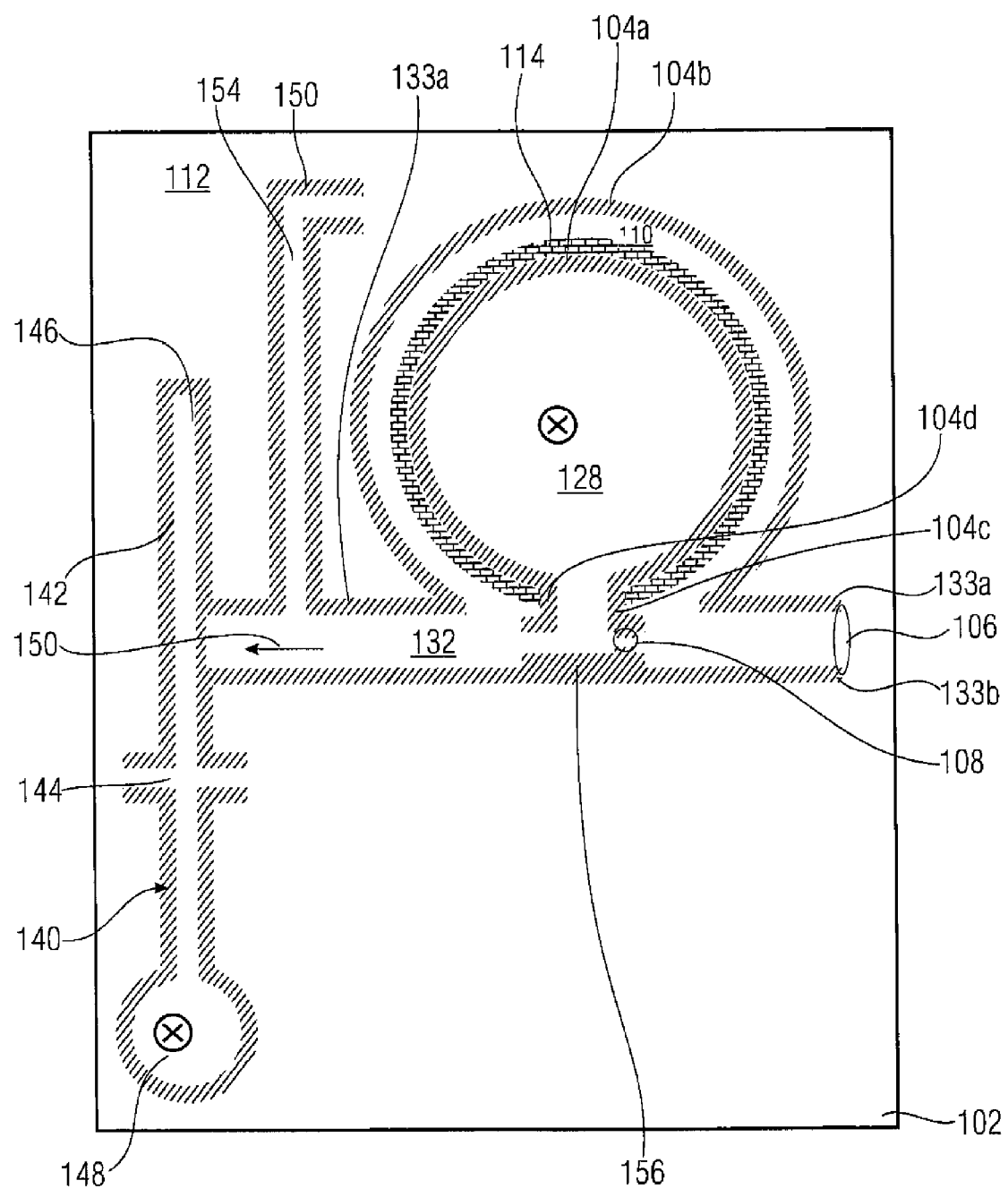
Figure 5:
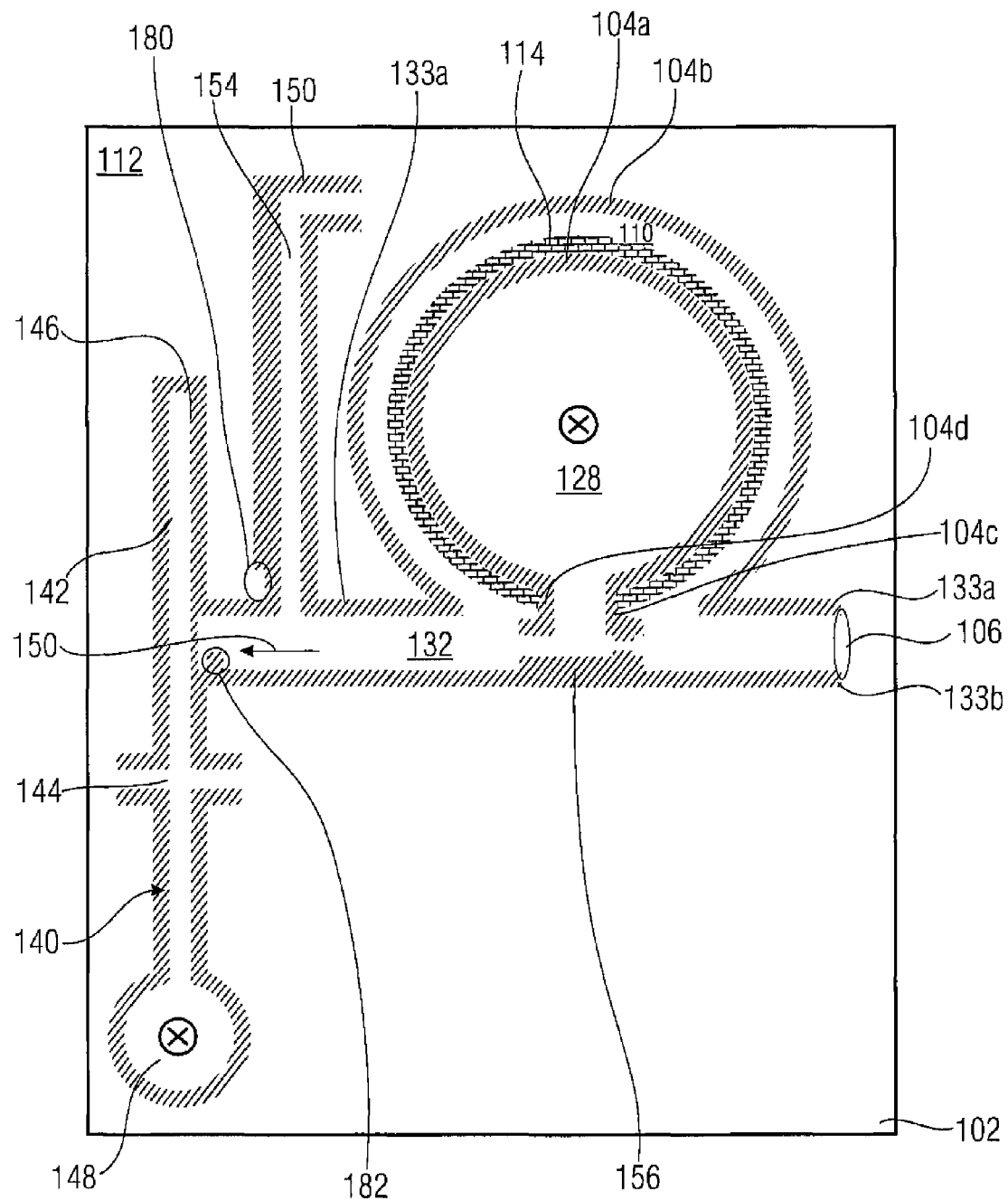
Figure 5:
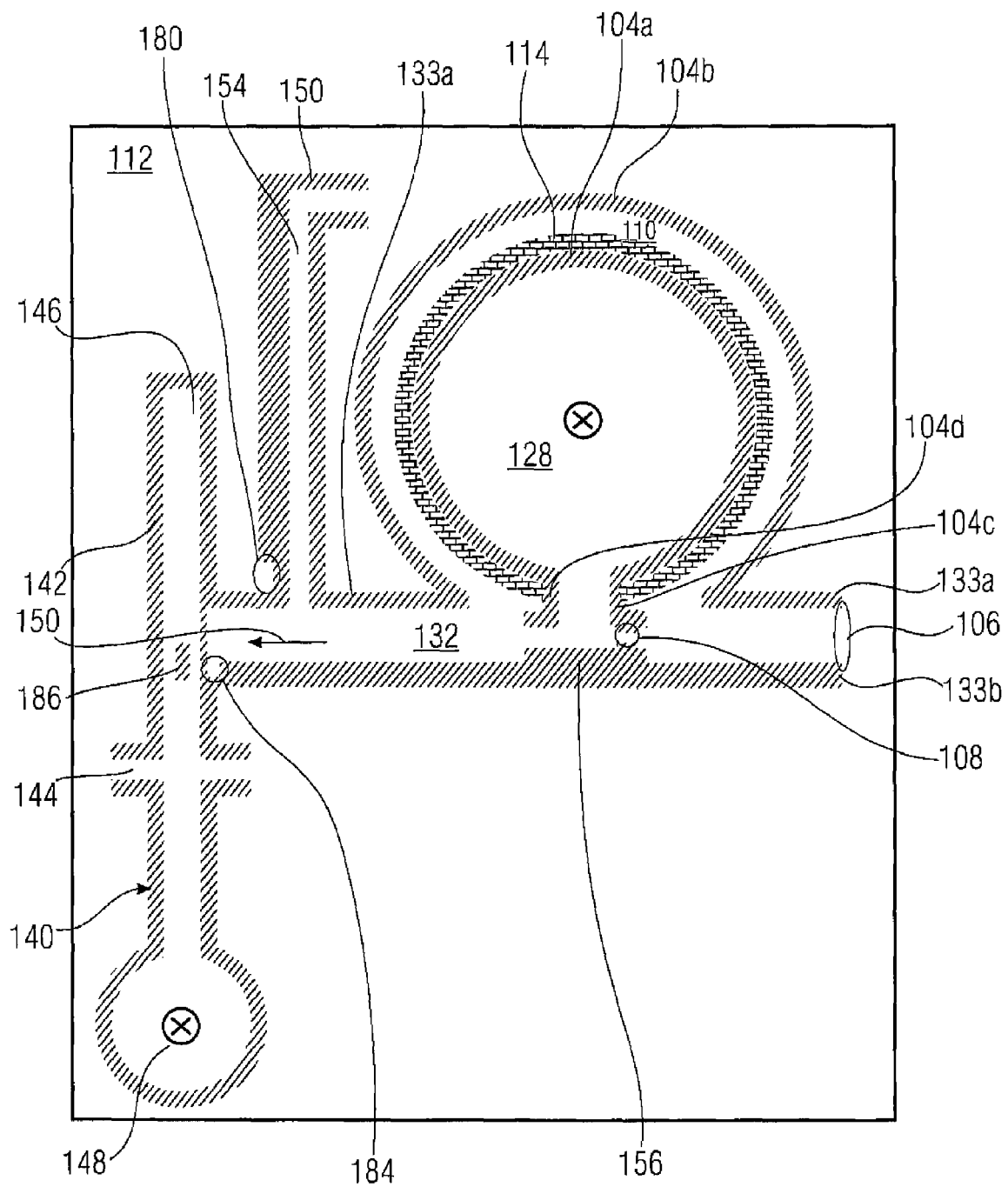

FIG. 5(A) shows a further micromechanical element 140 similar to that in FIG. 4(A), where, unlike FIG. 4(A), an asymmetric arrangement of the deflectable structure was selected with regard to the bolt 132, however, and where only the bias ring 110 shown at the top of FIG. 4(A) is employed. In the area of the predetermined breaking point 108, the trench 133b has a larger width 156. FIG. 5(A) shows the use of a bolt 132 with a two-sided support structure 150, 152, 154, 154', whereas FIG. 5(B) shows the utilization of a one-sided support structure 150, 154 for the bolt 132.

FIG. 5(C) shows the micromechanical structure of FIG. 5(B), wherein the second area 112 comprises a stop 180. The first area 110 rests at the stop 180 in the second position, the force with which the first area 110 is moveable to the second position being selected such as to enable a movement beyond the stop. In this manner it is ensured that there will be a sufficient displacement to a position underneath the element 140, however, at the same time there being sufficient "energy reserves" so that in the event of a reduction of the force by changing environmental factors, e.g. temperature, pressure, humidity, etc., withdrawal of the bolt 132 from the engagement with the element 140 is avoided.

In addition, the bolt 132 may be configured to have a recess 182 into which the portion 146 of the element 140 is received so as to be latched with the bolt. In this manner, a latching of the bolt and the element 140 is effected, so that the element will remain in the desired position even in the event of impacts. It shall be noted that the stop 180 and the recess 182 may be used alternatively or in combination.

FIG. 5(D) shows a similar structure to FIG. 5(C), however a hook 184 being formed instead of the recess 182. The portion 146 of the element 140 includes a recess 186, the hook 184 in the second position engaging the recess 186 of the micromechanical element 140, so that the element will remain in the desired position even in the event of impacts. It shall be noted that the stop 180 and the recess 182 may be used alternatively or in combination.

Figure 6:
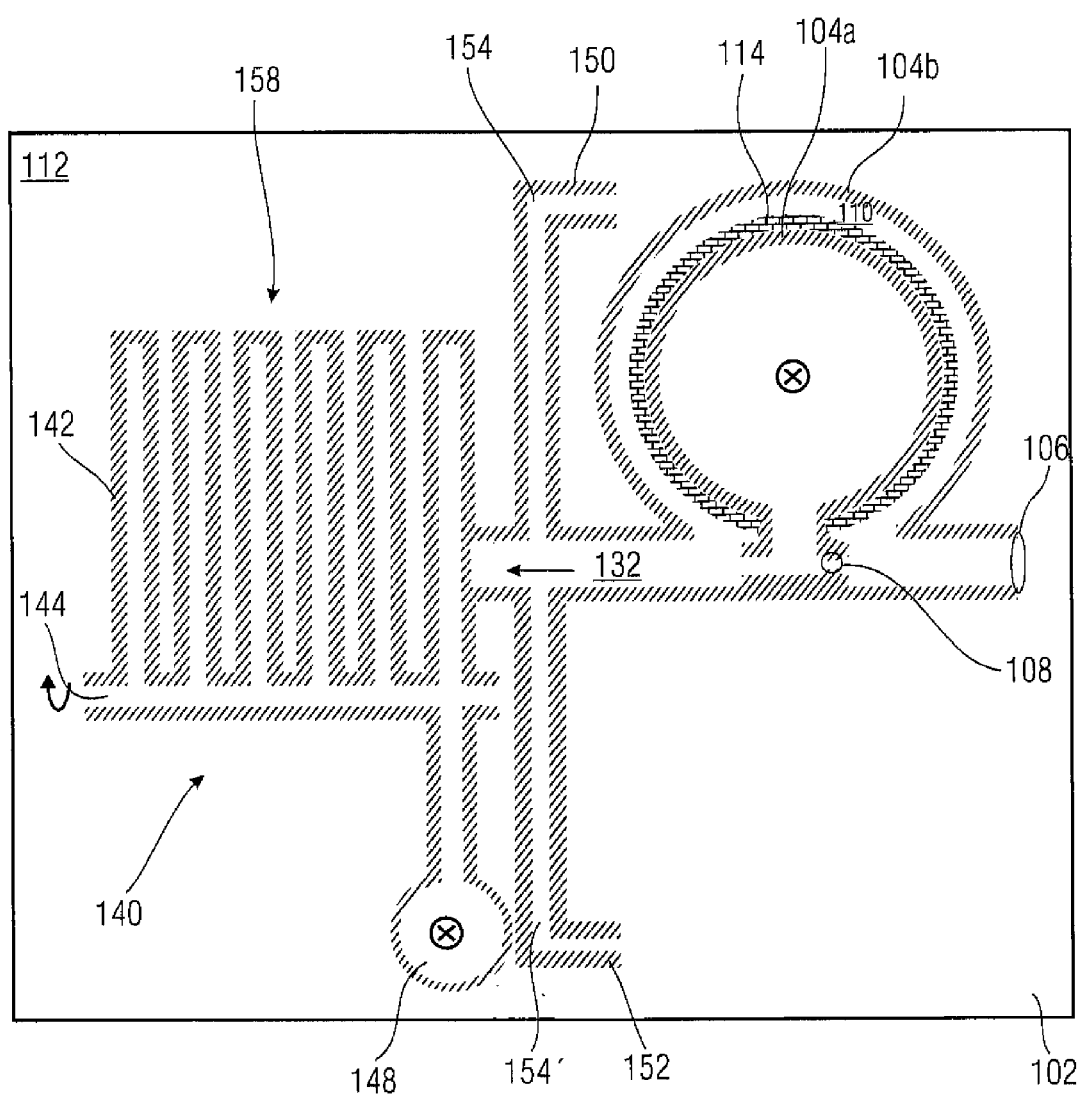
FIG. 6 shows a micromechanical structure comprising a further micromechanical element and the deflectable structure of FIG. 5(A)

FIG. 6 shows a further embodiment of a micromechanical device 140, the deflectable structure corresponding to that shown in FIG. 5(A). The micromechanical device 140 is constituted by the counter electrodes 158 of interdigital electrodes as may be used, e.g., for the resonant or quasi-stationary electrostatic drive of MEMS devices.

Figure 7:
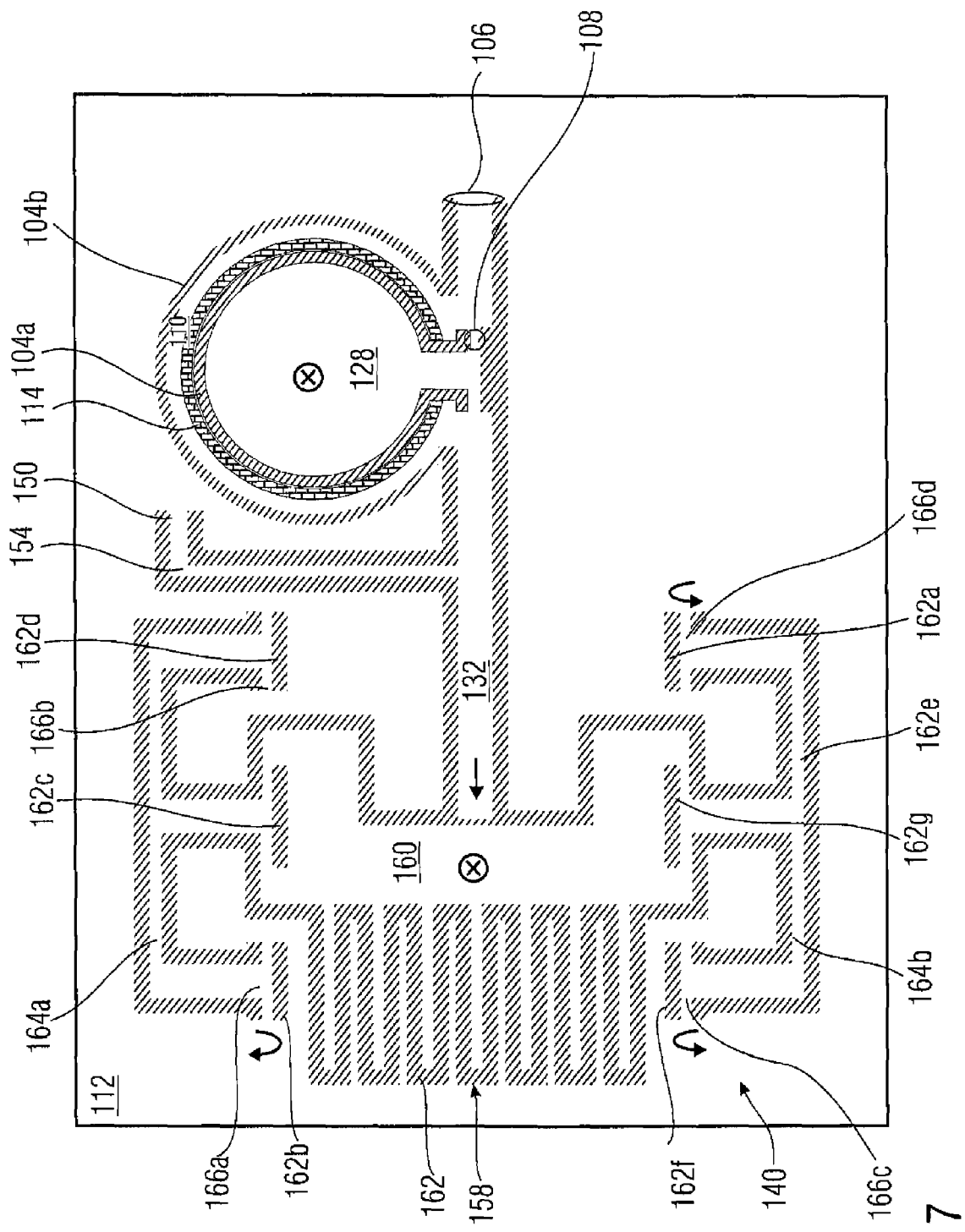
FIG. 7 shows a micromechanical structure comprising a still further micromechanical element and the deflectable structure of FIG. 5(B)

FIG. 7 shows a further embodiment wherein a deflectable structure according to FIG. 5(B) is used, so as to influence a still further micromechanical device 140, namely the counter electrodes 158 of interdigital electrodes as may be used, e.g., for a quasi-stationary phase-shifting mirror or relocatable mirror for optical path length modulation. An electrode plate 160 and its electrodes 158 are formed in the layer 102 by a trench structure 162. Along with the further trenches 162*a-d* and 162*e-h*, the trench structure 162 forms two suspensions 164*a* and 164*b* with bearings 166*a*-166*d* which enable the electrode plate 160 to be swiveled to a position above or below the surface of the layer 102. In the event of a breakage of the predetermined breaking point 108, the deflectable structure causes the bolt 132 to be displaced to a position below or above the electrode plate 160 so as to lock same in the desired position, the maximum amount relative to the layer surface being designed by the thickness of the layer 102, which also specifies the thickness of the bolt 132. The bolt 132 engages the electrode plate 160 such that the element 140 is held in parallel with the layer surface, i.e. that the restoring forces of the suspensions will not cause any alignment which is tilted relative to the layer surface. Additionally, several bolts which are symmetrically arranged may be provided which are actuated by one common or by several deflectable structures.

Figure 8:
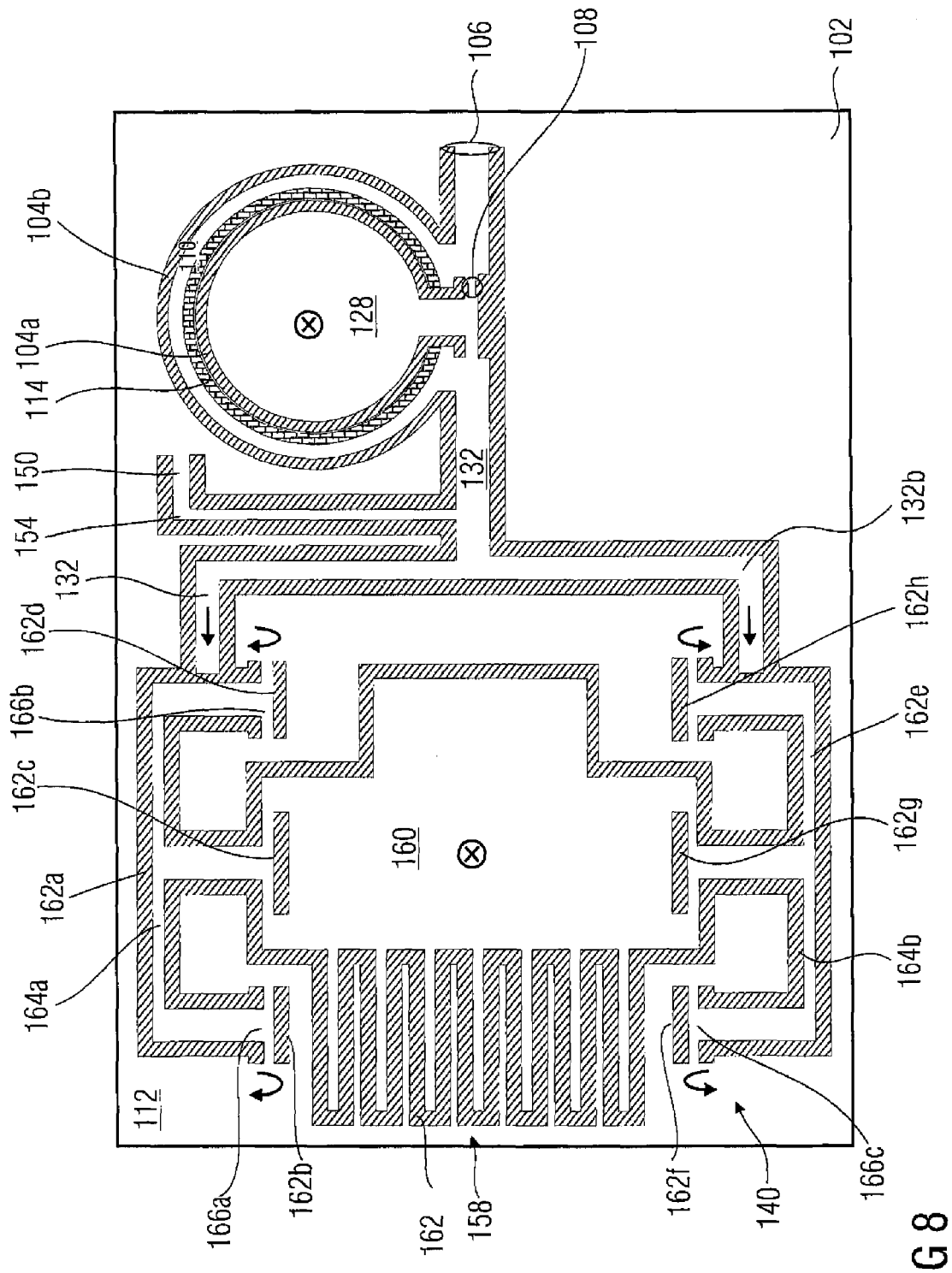
FIG. 8 shows a micromechanical structure comprising the micromechanical element of FIG. 7 and the deflectable structure of FIG. 5(B) in a further implementation.

FIG. 8 shows a further embodiment, wherein a deflectable structure similar to that of FIG. 5(B) is used in order to influence the element as has already been described with reference to FIG. 7. Unlike FIG. 7, the deflectable structure here does not act upon the electrode plate 160, but on the suspensions 164*a* and 164*b* thereof. For this purpose, the bolt 132 includes the portions 132*a* and 132*b* which extend to the suspensions 164*a* and 164*b*. In the event that the predetermined breaking point 108 breaks, the deflectable structure causes the bolt portions 132*a* and 132*b* to be displaced to a position below or above the suspensions 164*a* and 164*b* in order to lock them in the desired position in this manner. Unlike FIG. 7, the maximum amount relative to the layer surface is not defined by the thickness of the layer 102, but as a function of the position where the bolt portions 132*a* and 132*b* engage with the suspensions 164*a* and 164*b*. The closer the engagement location is to the bearings 166*a*-166*d*, the steeper will be the erection of the suspensions. The bolts 132*a* and 132*b* engage with the suspensions of the electrode plate 160 such that the element 140 is held in parallel with the layer surface, i.e. that the restoring forces of the remaining suspensions will not cause any alignment which is tilted relative to the layer surface. Additionally, several bolts which are symmetrically arranged may be provided which are actuated by one common or by several deflectable structures.

In the embodiments described with reference to FIGS. 4 to 8, the material is asymmetrically positioned in the rings for creating the mechanical stress. On the inside of a ring, a compression-generating material is provided, whereas on the outside of the ring, a material creating tensile stress is provided.

What is to be taken into account for the bias forms is that they are not deformed by the intrinsic mechanical stress prior to activation.

Figure 9:
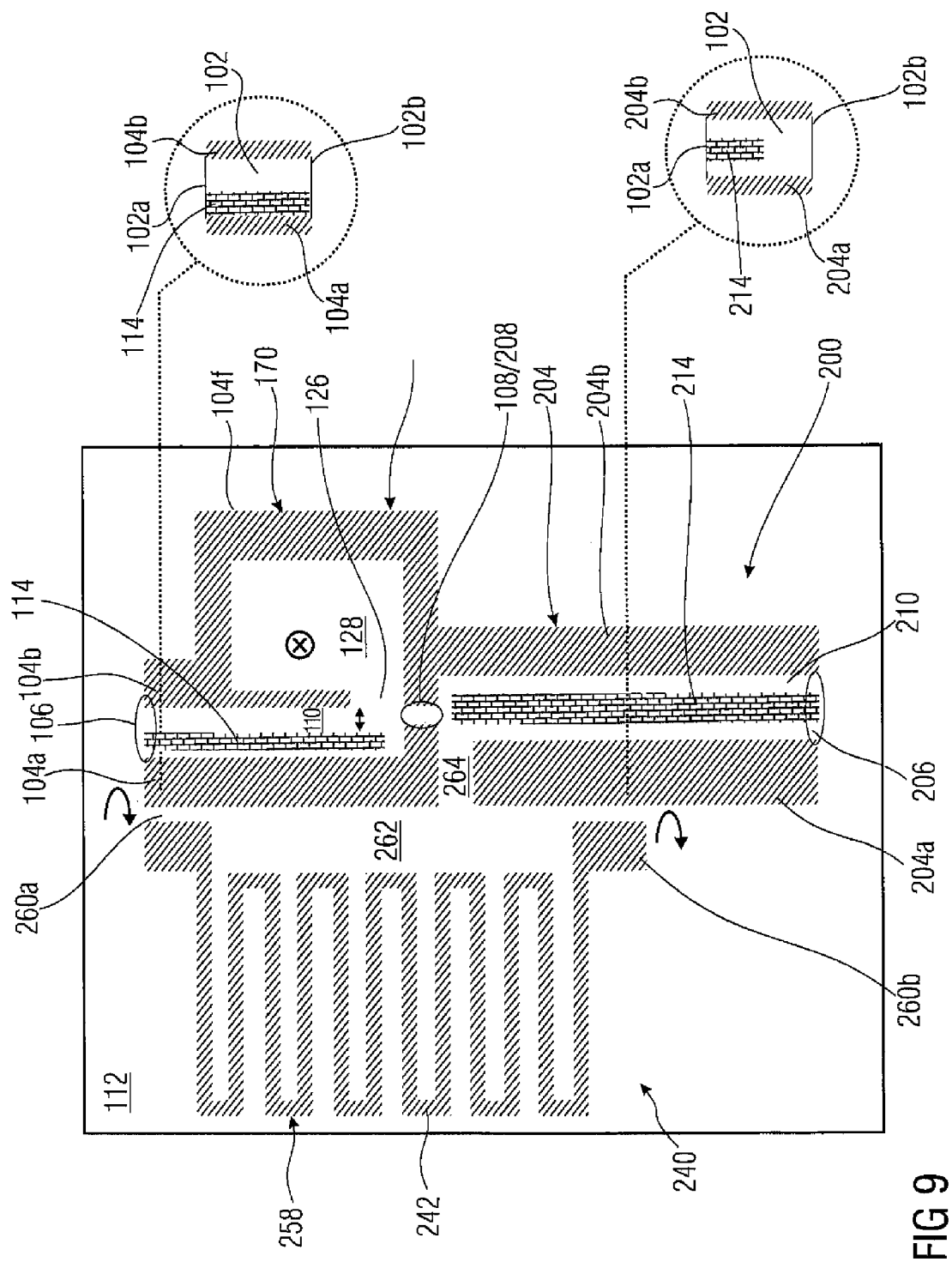
FIG. 9 shows a micromechanical structure comprising electrode fingers and the deflectable structure in accordance with a sixth embodiment.

FIG. 9 shows the inventive deflectable structure in combination with a micromechanical structure, FIG. 9 showing a deflectable structure in accordance with a sixth embodiment of the present invention.

The sixth embodiment, shown in FIG. 9, of the inventive deflectable structure which is provided by the reference numeral 200 in its entirety is formed in the layer 102. The layer 102 has a trench structure 204 formed therein which fully penetrates the layer 102, the trench structure 204 includes a first trench 204*a* and a second trench 204*b*. The trench structure 204 is formed such that a first junction 206 and a second junction 208 are formed between an area 210 of the layer 102 and the remaining layer 102. The area 210 is the area defined by the trench structure 204 and the junctions 206 and 208 and separated from the remaining area by the trench structure. FIG. 9 further shows a structure 214 which creates intrinsic stresses in the area 210 and extends essentially in parallel with the two trenches 204*a* and 204*b* and is formed at a distance from and advantageously symmetrically to the trenches 204*a* and 204*b* in the first area 210. FIG. 9 further represents a cross-section of part of the structure shown (see dashed-line circle). As an alternative to the continuous structure 214 shown in FIG. 9, same may also be configured such that it is segmented and has a plurality of separate portions. As may be seen, the structure 214 only partially penetrates the layer 102, and in the embodiment shown, it penetrates the substrate 102 starting from the first surface 102*a* without reaching its second surface 102*b*. In this manner, after the predetermined breaking point 208 has been broken, a movement of the structure is enabled which results in that a portion of the structure moves to a position above or below the surface of the layer. The predetermined breaking point 208 may be interrupted using a small amount of thermal expenditure or mechanical expenditure, as was explained above. Advantageously, the predetermined breaking point 208 has a dimension of about 0.1 μm to about 5 μm. In addition, provision may be made for thinning the layer 102 in the area of the junction 208, so that it will have a reduced thickness relative to the remaining layer so as to achieve reliable breakage at this location upon applying the thermal energy or the mechanical energy.

FIG. 9 further shows a deflectable structure 170 which is formed along with the structure 200. The structure 170 essentially corresponds to the structure described with reference to FIG. 3, reference being made to the description of same. The structure 170 has the same function as the structure shown in FIG. 3. In the event of the predetermined breaking point 108/208 breaking, the structure 170 causes the break edges to move apart from one another so as to effect reliable interruption.

FIG. 9 further shows a micromechanical device 240 which is connected to the deflectable structure 200. The micromechanical device 240 is formed by a trench 242 and comprises counter electrodes 258 of interdigital electrodes as may be employed, e.g., for the resonant or quasi-stationary electrostatic drive of MEMS devices. The micromechanical device 240 further comprises a first bearing area 260a defined between the trench 242 of the micromechanical device 240 and the trench 104a of the structure 170, and a second bearing area 260b defined between the trench 242 of the micromechanical device 240 and the trench 204a of the structure 200. The area 262 of the micromechanical device 240, which is connected to the structure 200 via an area 264, is located between the bearing areas 260a and 260b. The micromechanical device 240 is rotatable about the bearing areas 260a and 260b, so that the electrodes 258 may be arranged at an angle relative to the layer surface—above or below the surface. The force necessary for this is provided by the structure 200 after breakage of the predetermined breaking point 108/208.

It shall be noted at this point that the arrangement of the structure 170 in FIG. 9 is optional. If it is ensured, on the basis of the type of the severing of the predetermined breaking point, that the break edges will not "get caught", the structure 170 may be dispensed with.

Figure 10:
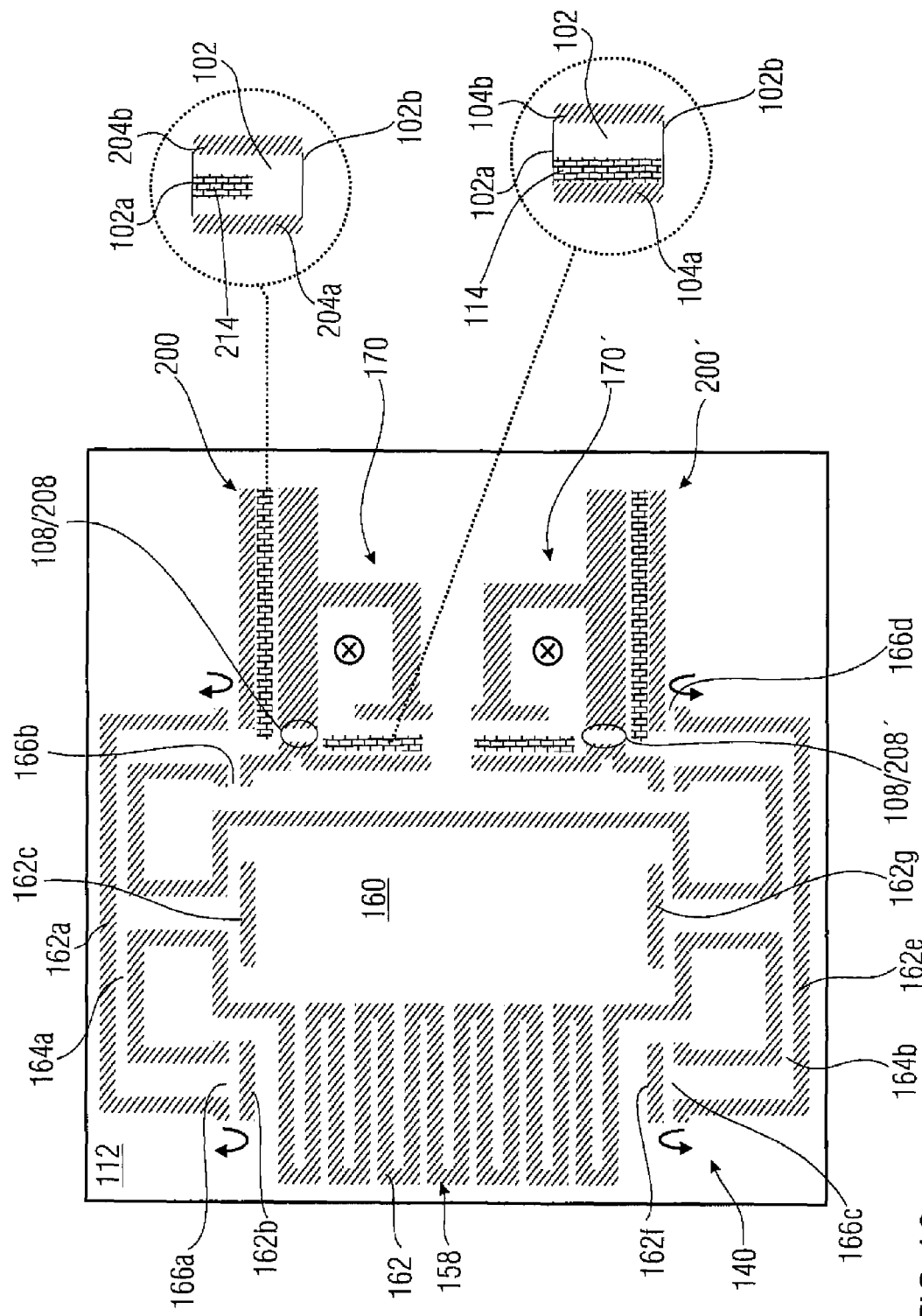
FIG. 10 shows a micromechanical structure comprising the micromechanical element of FIG. 8 and two deflectable structures of FIG. 9.

FIG. 10 shows the use of the structure, described with reference to FIG. 9, with a micromechanical element 140 as was already described with reference to FIG. 7. Instead of the deflection and locking as was described in FIG. 7, here, the element 140 is deflected, using the structures 200 and 200', and arranged at a distance from the layer surface once the predetermined breaking points 108/208 and 108/208' have been severed. The structures 170/170' are optionally provided for ensuring separation of the break edges.

Figure 11:
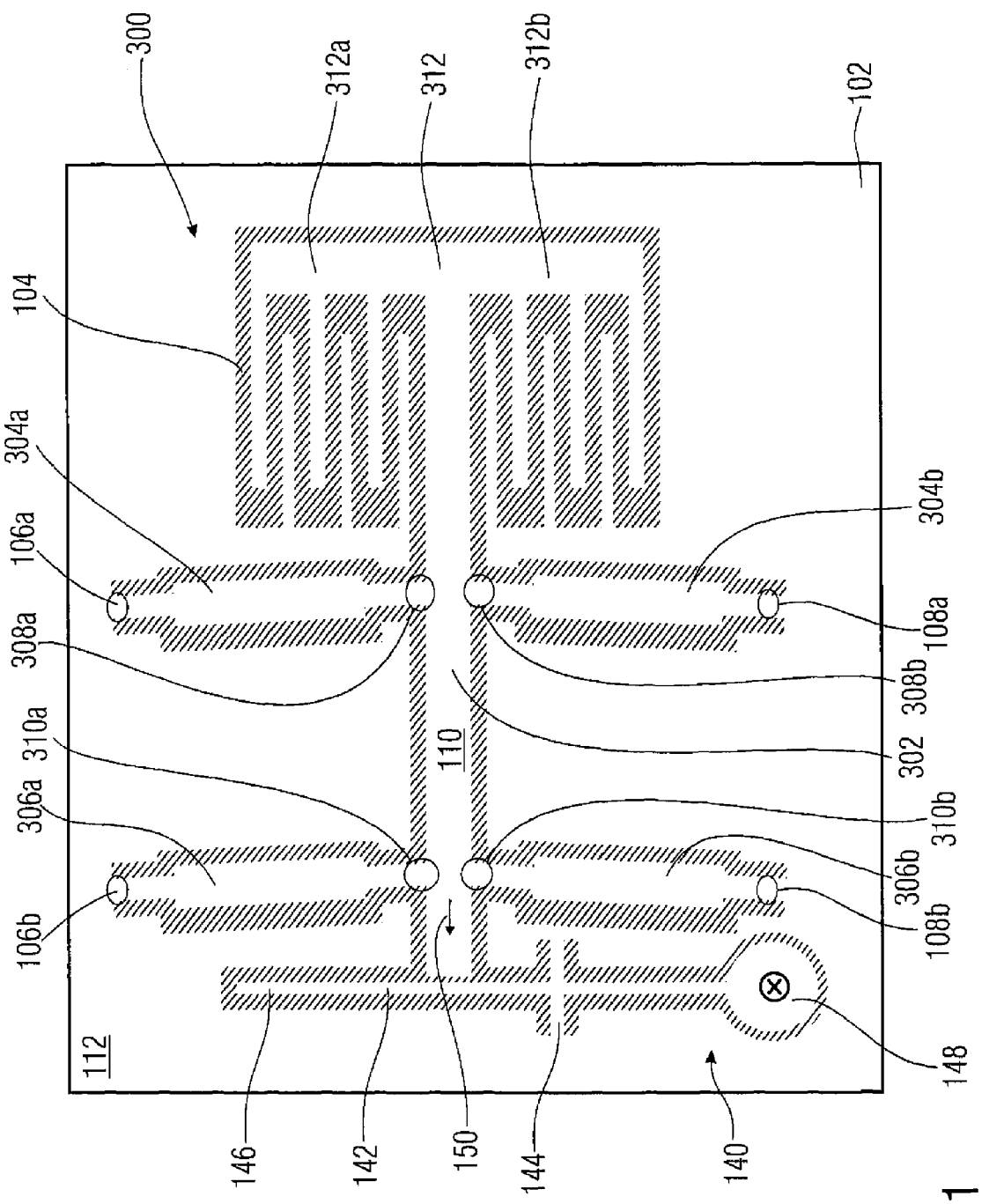
FIG. 11 shows a top view of a deflectable structure in accordance with a further embodiment of the present invention.

FIG. 11 shows a top view of a deflectable structure in accordance with a further embodiment of the present invention. The deflectable structure 300 is formed in a layer 102 (e.g. a substrate or a plate), which is schematically shown in FIG. 11. The layer 102 has a trench structure 104 formed therein which fully penetrates the layer. The trench structure 104 separates a first area 110 of the layer 102 from a second area 112 of the layer 102. The first area 110 is connected to the second area 112 via junctions 106a, 106b and 108a, 108b. The first area 110 includes a central portion 302 and two essentially opposite pairs of suspensions 304a, 304b and 306a, 306b, the first junction 106a being arranged between the second area 112 and the first suspension 304a, the second junction 108a being arranged between the second area 112 and the second suspension 304b, the third junction 106b being arranged between the second area 112 and the third suspension 306a, and the fourth junction 108b being arranged between the second area 112 and the fourth suspension 306b.

The central portion 302 may be moved from the first position, shown in FIG. 11, to the second position in the direction which is parallel to a surface of the layer 102, which is indicated by the arrow 150. The first suspension 304a and the second suspension 304b and the third suspension 306a and the fourth suspension 306b are arranged, in the first position, such that the first and third junctions 106a, 106b and the second and fourth junctions 108a, 108b are arranged, in the direction of the movement of the central portion 302, before the respective suspension locations 308a, 308b, 310a, 310b, where the suspensions 304a, 304b, 306a, 306b are each connected to the central portion 302. In the second position, the suspensions 304a, 304b, 306a, 306b are arranged such that the first and third junctions 106a, 106b and the second and fourth junctions 108a, 108b are arranged, in the direction of the movement of the central portion 302, behind the respective suspension locations 308a, 308b, 310a, 310b.

The central portion 302 further comprises an area 312 via which a force for moving to the second position may be applied. The area 312 comprises a plurality of electrode structures 312a, 312b for electrostatic coupling to external counter electrode structures.

Upon application of a force across the electrodes 312a, 312b or across other suitable structures, the suspensions 304a, 304b, 306a, 306b are urged in the direction 150 until the bistable suspensions 304a, 304b, 306a, 306b are moved from the first position, shown in FIG. 11, to the above-described location in the second position, where they will then remain as long as no inverse force is applied. This fundamental property of such MEMS elements (of the suspensions 304a, 304b, 306a, 306b) is described, e.g., by W. Noell, et al. in "Applications of SOI-based optical MEMS" in JSTQE "Optical MEMS", February 2002.

In the example shown in FIG. 11, the micromechanical element 140 described with reference to FIG. 4(a) is formed in the layer, it being possible for this element 140 to be locked once it has been deflected by the central area 302—subsequent to its movement to the second position. Alternatively, the structure 300 described with reference to FIG. 11 may also be used with the other, above-described micromechanical elements.

The above-described structures are manufactured in that the bias structure is etched, along with electrical insulation trenches, into a BSOI actuator layer, and is subsequently filled up with a thermal oxide and poly-Si which each generate compressive stress on mono-Si. The structures on the surface are polished, and after further processing of the devices by means of standard processes, once the elements have been finished and separated, the structure to be deflected may be activated using two sample needles or, alternatively, using one needle and melting through the fixture.

Advantageously, the present invention in the form of the deflectable structure with a microscanner, one-dimensional and two-dimensional, is used for three-dimensional deflection of the lateral drive electrodes, or of the actuator. In addition, the inventive structure with a phase-shifting mirror or relocatable mirror may be employed for optical path length modulation, a translation mirror, for three-dimensional deflection of the lateral drive electrodes or of the actuator.

In the above-described embodiments, the deflectable structure is located adjacent to the micromechanical element, and a bolt formed in the first area acts upon the micromechanical element. The present invention is not limited to this configuration. In situations where the spatial conditions do not allow the deflectable structure and the micromechanical element to be disposed adjacently, a transfer element, for example a mobile lever arm formed in the layer, may be provided which transfers the movement of the deflectable structure to the micromechanical element. In addition, the deflection achievable by the deflectable structure (e.g. 5 μm) may not be sufficient (e.g., 15 μm are necessary). In this case, a lever arm having a desired translation (e.g. 1:3) may be provided between the deflectable structure and the micromechanical element.

The present invention may further include a further fixation of the micromechanical element once it has been locked by the deflectable structure. In cases where the arrangement is subject to mechanical impact, for example, the force provided by the deflectable structure may possibly not be sufficient to lock the micromechanical element in its deflected position. To avoid that the micromechanical element again leaves it deflected position, provision may be made for the deflected structure and/or the deflected micromechanical element to be additionally fixed, e.g. by applying a drop or several drops of a fixation material by means of a dispenser, for example an adhesive or ink.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A deflectable structure comprising:
a layer comprising a first area and a second area;
a trench structure in the layer which penetrates the layer and separates the first area from the second area;
a first junction between the first area and the second area; and
a second junction between the first area and the second area; wherein
by breakage of the second junction, the first area is moveable from a first, permanent position with regard to the second area to a second position, that is deflected as compared to the first position, with regard to the second area by applying a force; and
after deflection, the first area remains in the second position due to a built in intrinsic stress in the first area.

2. The deflectable structure as claimed in claim 1, wherein the second junction is formed as a predetermined breaking point between the first area and the second area; and
the first area comprises a structure generating, in cooperation with the first area, the intrinsic stress so as to bias the first area relative to the second area in such a manner that breakage of the predetermined breaking point causes a movement of the first area from the first, original position to the second, deflected position with regard to the second area.

3. The deflectable structure as claimed in claim 2, wherein the structure is formed to cause a movement in the direction parallel with a surface of the layer.

4. The deflectable structure as claimed in claim 3, wherein the structure penetrates the layer.

5. The deflectable structure as claimed in claim 2, wherein the structure is implemented to cause a movement in the direction to above or below a surface of the layer.

6. The deflectable structure as claimed in claim 5, wherein the structure partially penetrates into the layer.

7. The deflectable structure as claimed in claim 2, wherein the structure is a continuous structure or a segmented structure.

8. The deflectable structure as claimed in claim 2, wherein the structure comprises at least one portion made of a material creating stress.

9. The deflectable structure as claimed in claim 8, wherein the material creating stress causes tensile stress or compressive stress.

10. The deflectable structure as claimed in claim 8, wherein the at least one portion of the structure is asymmetrically arranged in the first area so as to cause a movement transverse to a longitudinal dimension of the at least one portion.

11. The deflectable structure as claimed in claim 8, wherein the at least one portion of the structure is symmetrically arranged in the first area so as to cause a movement in a direction along a longitudinal dimension of the at least one portion.

12. The deflectable structure as claimed in claim 2, comprising a plurality of structures symmetrically or asymmetrically arranged in the first area.

13. The deflectable structure as claimed in claim 2, wherein the first area is of annular or rectangular shape.

14. The deflectable structure as claimed in claim 2, wherein the first area comprises an actuating element which, upon the predetermined breaking point breaking, is deflected, the first junction connecting the actuating element to the second portion of the layer.

15. The deflectable structure as claimed in claim 14, wherein the structure comprises a plurality of portions which are arranged symmetrically with regard to the actuating element.

16. The deflectable structure as claimed in claim 14, comprising a bearing structure which is formed in the layer and is connected to the actuating element.

17. The deflectable structure as claimed in claim 2, wherein the first area further comprises a field which may comprise a force for breaking through the predetermined breaking point applied to it.

18. The deflectable structure as claimed in claim 1, wherein the first area comprises a central portion and two essentially opposite suspensions, the first junction being arranged between the second area and the first suspension, and the second junction being arranged between the second area and the second suspension.

19. The deflectable structure as claimed in claim 18, wherein the central portion is moveable from the first position to the second position in a direction parallel with a surface of the layer, the first suspension and the second suspension being arranged, in the first position, such that the first junction and the second junction are disposed, in the direction of the movement of the central portion, before the respective suspension locations where the first and second suspensions are each connected to the central portion, and the first suspension and the second suspension being arranged, in the second position, such that the first junction and the second junction are arranged, in the direction of the movement of the central portion, behind the respective suspension locations.

20. The deflectable structure as claimed in claim 18, comprising two further suspensions which are arranged essentially opposite each other.

21. The deflectable structure as claimed in claim 18, wherein the central portion and the suspensions are each beam-shaped.

22. The deflectable structure as claimed in claim 18, wherein the central portion further comprises an area across which a force for moving to the second position may be applied.

23. The deflectable structure as claimed in claim 22, wherein the area comprises a plurality of electrode structures for electrostatic coupling to external counter electrode structures, a piezoelectric structure, and/or a structure which may be thermally or fluidically activated.

24. The deflectable structure as claimed in claim 1, wherein the second area comprises a stopping portion on which the first area rests while in the second position to avoid a movement of the first area in a direction back towards the first position, the force by which the first area is moveable to the second position being selected such as to enable a movement beyond the stopping portion.

25. A micromechanical structure comprising:
a micromechanical element; and
a deflectable structure, the deflectable structure comprising:
- a layer comprising a first area and a second area;
- a trench structure in the layer which penetrates the layer and separates the first area from the second area;
- a first junction between the first area and the second area; and
- a second junction between the first area and the second area; wherein by breakage of the second junction, the first area is moveable from a first, permanent position with regard to the second area to a second position, that is deflected as compared to the first position, with regard to the second area by applying a force formed therein;

after deflection, the first area remains in the second position due to a built in intrinsic stress in the first area; and when in the second position, the first area of the deflectable structure acts to apply a force upon the micromechanical structure.

26. The micromechanical structure as claimed in claim 25, wherein
the micromechanical element is deflectable with regard to a surface of the layer; and
when in the second position, the deflectable structure holds the micromechanical element in a deflected position.

27. The micromechanical structure as claimed in claim 26, wherein
the micromechanical element may be swiveled about an axis parallel with the layer; and
when in the second position, an actuating element of the deflectable structure is arranged below or above the micromechanical element in order to hold the micromechanical element in the swiveled position.

28. The micromechanical structure as claimed in claim 26, wherein
the micromechanical element comprises a suspension defined in the layer so as to suspend the micromechanical element at a predetermined position above or below a surface of the layer.

29. The micromechanical structure as claimed in claim 25, wherein a physical property of the micromechanical element is adjusted by the movement of the deflectable structure from the first position to the second position.

30. The micromechanical structure as claimed in claim 25, further comprising:
a micromechanical component which is driven translationally or rotationally; wherein
the micromechanical element includes an electrode comb arranged to provide a static or resonant deflection of the micromechanical component.

31. The micromechanical structure as claimed in claim 30, wherein the micromechanical component comprises a sensor.

32. The micromechanical structure as claimed in claim 25, wherein the first area of the deflectable structure comprises a recess with which the micromechanical element engages in the second position of the deflectable structure.

33. The micromechanical structure as claimed in claim 25, wherein
the micromechanical element comprises a recess;
the first area of the deflectable structure comprises a hook; and
the hook is arranged to engage with the recess when in the second position.

34. The deflectable structure as claimed in claim 2, wherein the predetermined breaking point is arranged such that a breakage of the predetermined breaking point will be caused by an applied thermal energy or mechanical force.

35. The deflectable structure as claimed in claim 34, wherein the thermal energy is provided by electrical energy or electromagnetic radiation that is applied to the predetermined breaking point.

* * * * *